United States Patent
Juengling

(10) Patent No.: US 9,875,960 B1
(45) Date of Patent: *Jan. 23, 2018

(54) MEMORY ARRAYS

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/681,561

(22) Filed: Aug. 21, 2017

Related U.S. Application Data

(63) Continuation of application No. 15/391,025, filed on Dec. 27, 2016, now Pat. No. 9,773,728.

(51) Int. Cl.
*H01L 23/52* (2006.01)
*H01L 23/522* (2006.01)
*H01L 23/528* (2006.01)
*H01L 27/108* (2006.01)

(52) U.S. Cl.
CPC ........ *H01L 23/5225* (2013.01); *H01L 23/528* (2013.01); *H01L 23/5226* (2013.01); *H01L 27/10808* (2013.01); *H01L 27/10826* (2013.01)

(58) Field of Classification Search
CPC ............. H01L 23/5225; H01L 23/5226; H01L 23/528; H01L 27/10808; H01L 27/10826
See application file for complete search history.

(56) References Cited

U.S. PATENT DOCUMENTS

| | | |
|---|---|---|
| 8,741,758 B2 | 6/2014 | Juengling |
| 2006/0046407 A1 | 3/2006 | Juengling |
| 2009/0237996 A1 | 9/2009 | Kirsch et al. |
| 2011/0193157 A1 | 8/2011 | Juengling |
| 2014/0185355 A1 | 7/2014 | Juengling |

*Primary Examiner* — Nicholas Tobergte
(74) *Attorney, Agent, or Firm* — Wells St. John P.S.

(57) ABSTRACT

Some embodiments include memory arrays having rows of fins. Each fin includes a first pedestal, a second pedestal and a trench between the first and second pedestals. A first source/drain region is within the first pedestal, a second source/drain region is within the second pedestal, and a channel region is along the trench between the first and second pedestals. The rows are subdivided amongst deep-type (D) rows and shallow-type (S) rows, with the deep-type rows having deeper channel regions than the shallow-type rows. Some embodiments include rows of fins in which the channel regions along individual rows are subdivided amongst deep-type (D) channel regions and shallow-type (S) channel regions, with the deep-type channel regions being below the shallow-type channel regions.

19 Claims, 16 Drawing Sheets

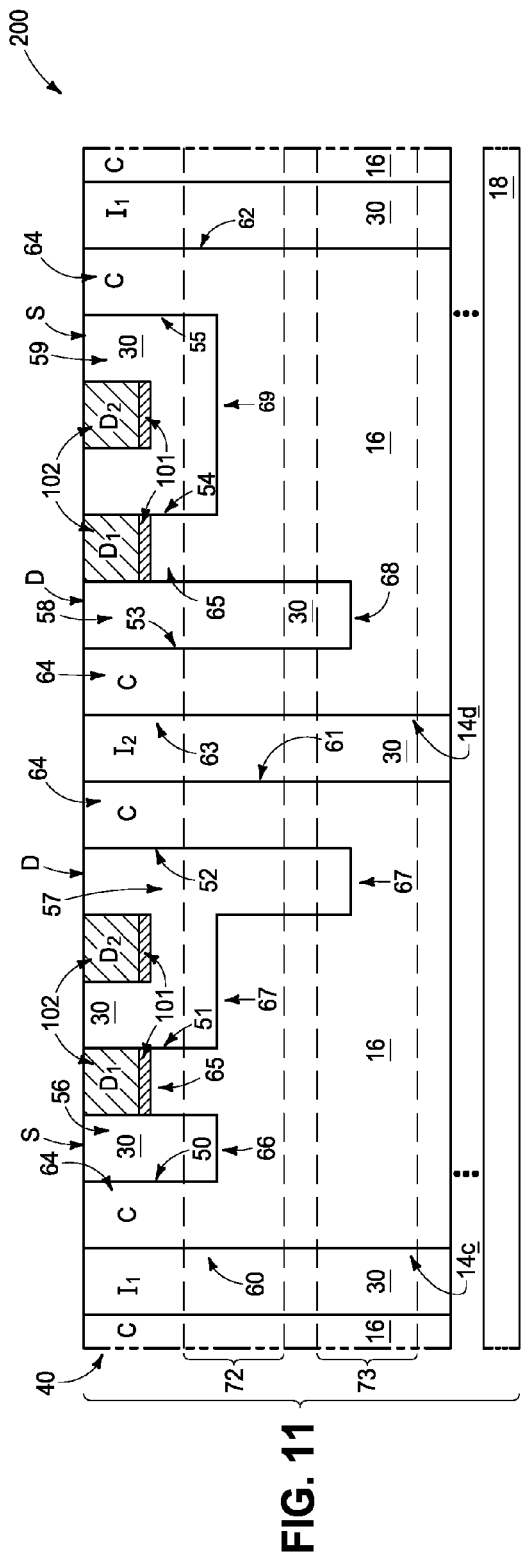
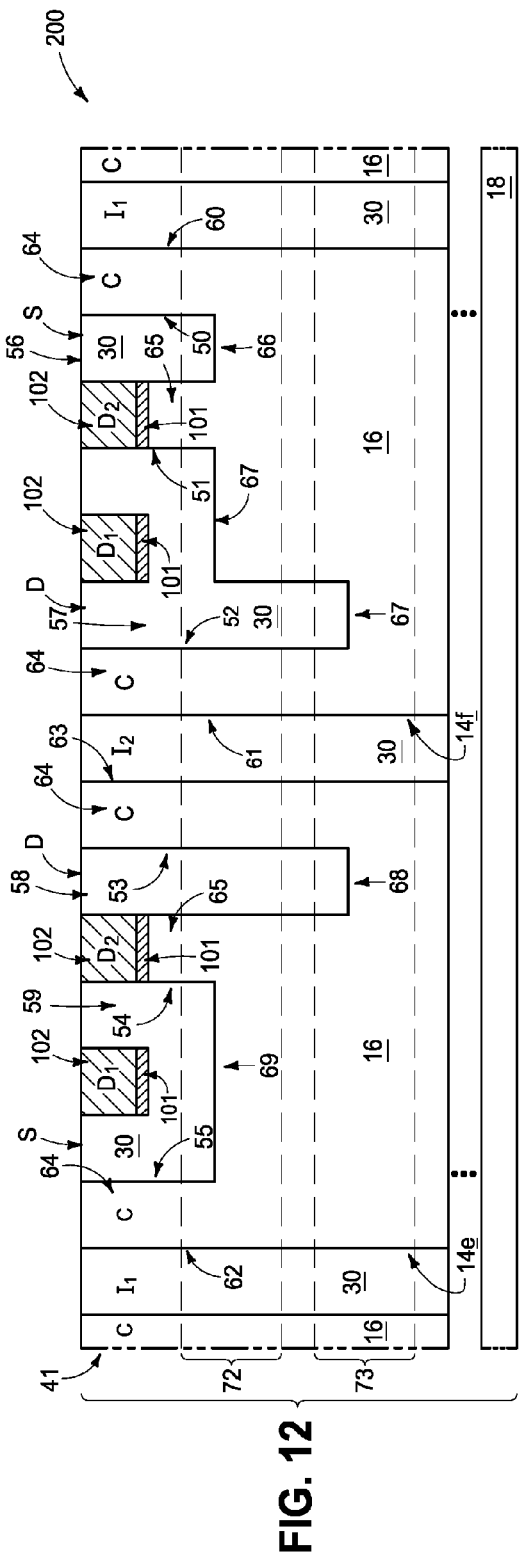

MEMORY ARRAYS

RELATED PATENT DATA

This patent resulted from a continuation of U.S. patent application Ser. No. 15/391,025, which was filed Dec. 27, 2016, which issued as U.S. Pat. No. 9,773,728, and which is hereby incorporated herein by reference.

TECHNICAL FIELD

Memory cells. Each of the memory cells includes an access device having a fin structure.

BACKGROUND

Fin field effect transistors (finFETs) may be incorporated into integrated circuitry. The finFETs include a fin (a tall thin semiconductor member) extending generally perpendicularly from a substrate. The fin comprises a pair of opposing sidewalls, and gate material is provided along at least one of the sidewalls. The gate material is spaced from said at least one of the sidewalls by gate dielectric material. A pair of source/drain regions is provided within the fin, and a channel region extends between the source/drain regions. In operation, the gate is utilized to selectively control current flow within the channel region.

The finFETs may be utilized as access transistors in integrated memory arrays; such as, for example, dynamic random access memory (DRAM) arrays. In some applications the finFETs may be incorporated into crosshair memory cells. In such applications the source/drain regions are on a pair of upwardly-projecting pedestals, and the channel region is along a trench (i.e., trough) extending between the pedestals. A charge-storage device (for instance, a capacitor) is electrically coupled with one of the source/drain regions, and a digit line is electrically coupled with the other of the source/drain regions. The gate is beneath the source/drain regions, and extends along the trench comprising the channel region. Example finFET structures, and example crosshair memory cells, are described in U.S. Pat. No. 8,741,758, and U.S. patent publication numbers 2009/0237996 and 2011/0193157.

It is desired to develop improved finFET devices which are suitable for utilization in highly integrated applications, to develop improved architectures for incorporating finFET devices into highly integrated memory and/or other circuitry, and to develop improved methods of fabricating architectures comprising finFET devices.

BRIEF DESCRIPTION OF THE DRAWINGS

FIGS. 10-13 are a diagrammatic top view and diagrammatic cross-sectional side views of a region of an example memory array. The view of FIG. 11 is along the lines 11-11 of FIG. 10; the view of FIG. 12 is along the lines 12-12 of FIG. 10; and the view of FIG. 13 is along the lines 13-13 of FIG. 10. The cross-sectional views of FIGS. 11-13 are expanded relative to the top view of FIG. 10 in order to better show some of the illustrated structures.

DETAILED DESCRIPTION OF THE ILLUSTRATED EMBODIMENTS

Figure 1:
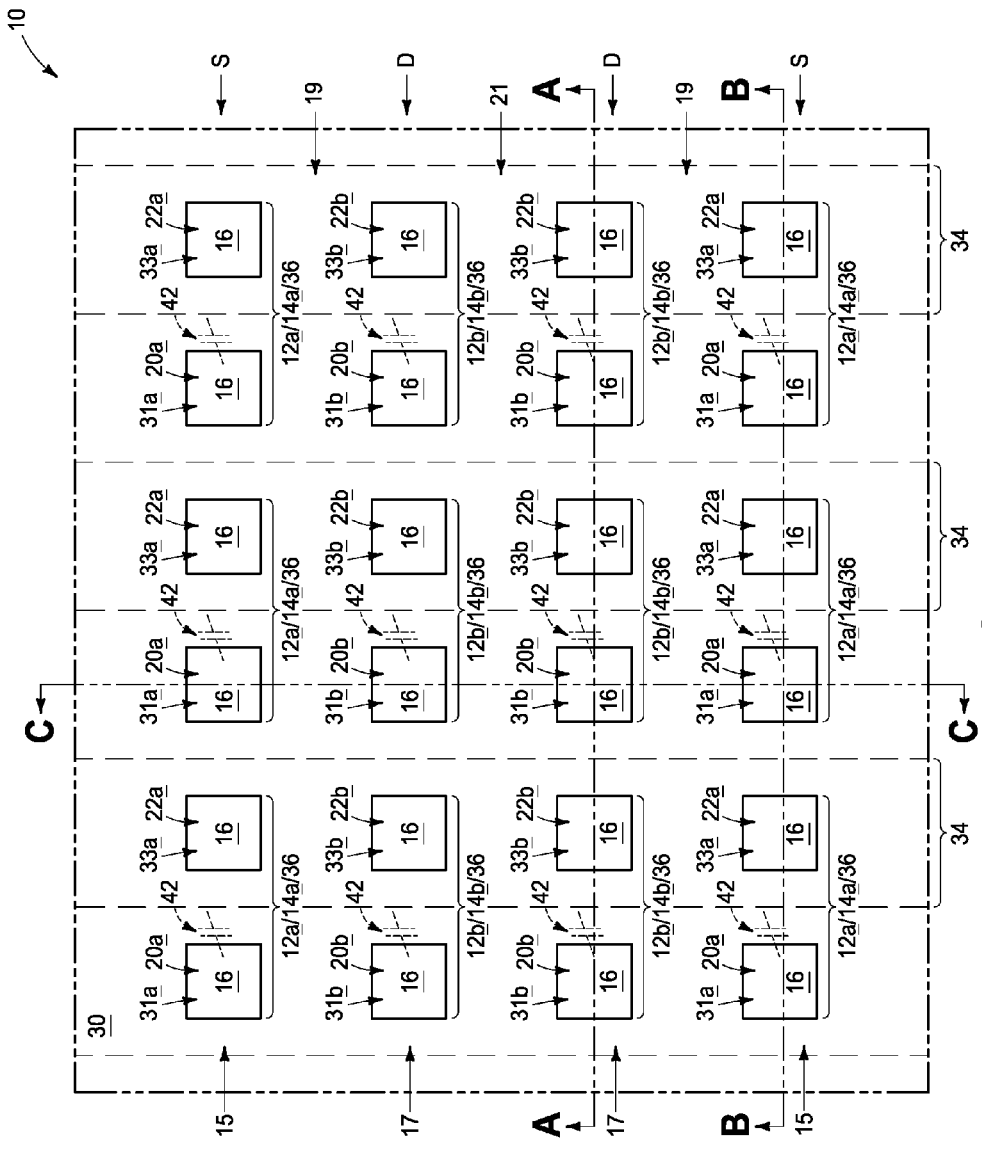
FIGS. 1-4 are a diagrammatic top view and diagrammatic cross-sectional side views of a region of an example memory array. The view of FIG. 2 is along the lines A-A of FIGS. 1 and 4; the view of FIG. 3 is along the lines B-B of FIGS. 1 and 4; and the view of FIG. 4 is along the lines C-C of FIGS. 1, 2 and 3.
Figure 2:
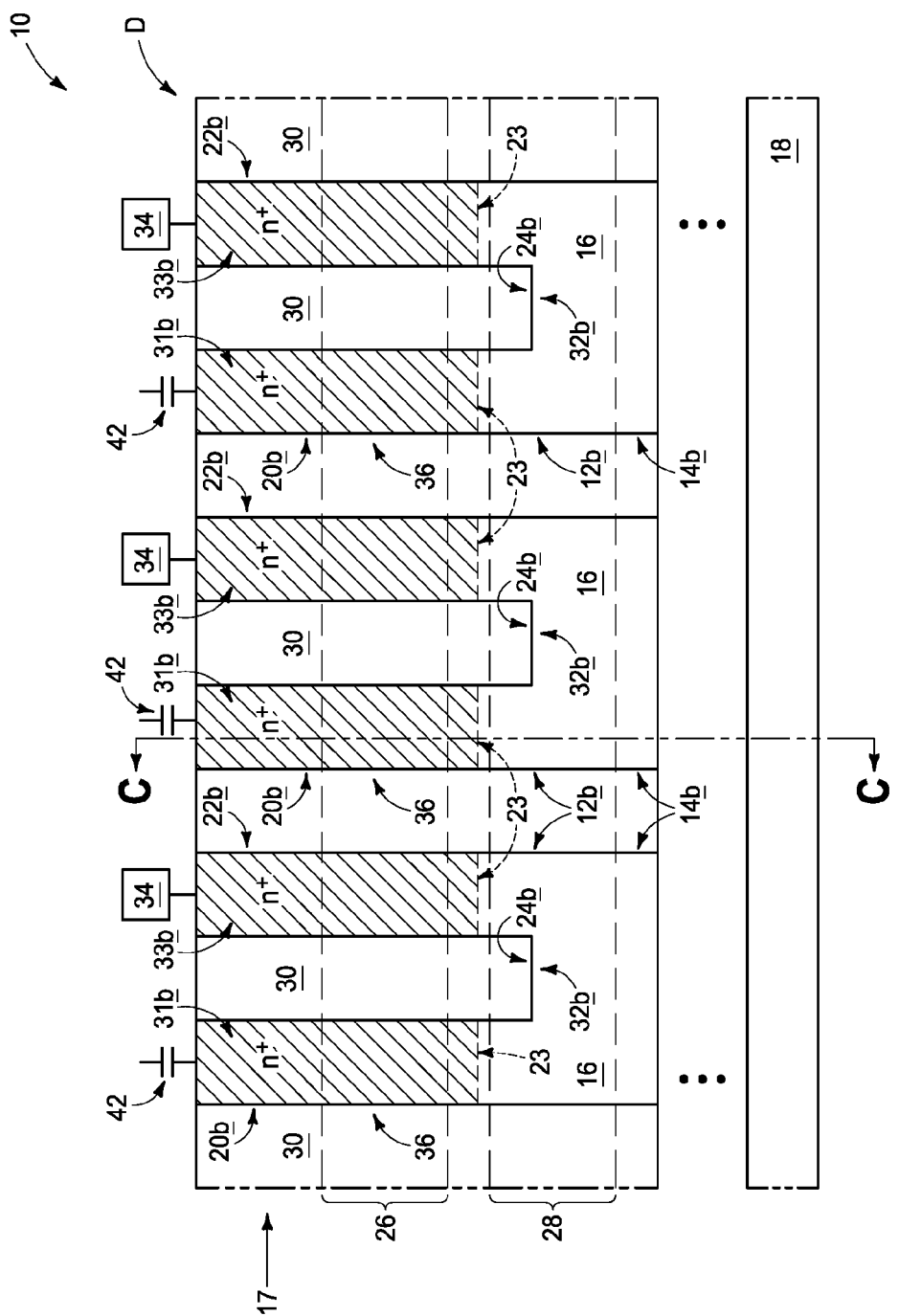
Figure 3:
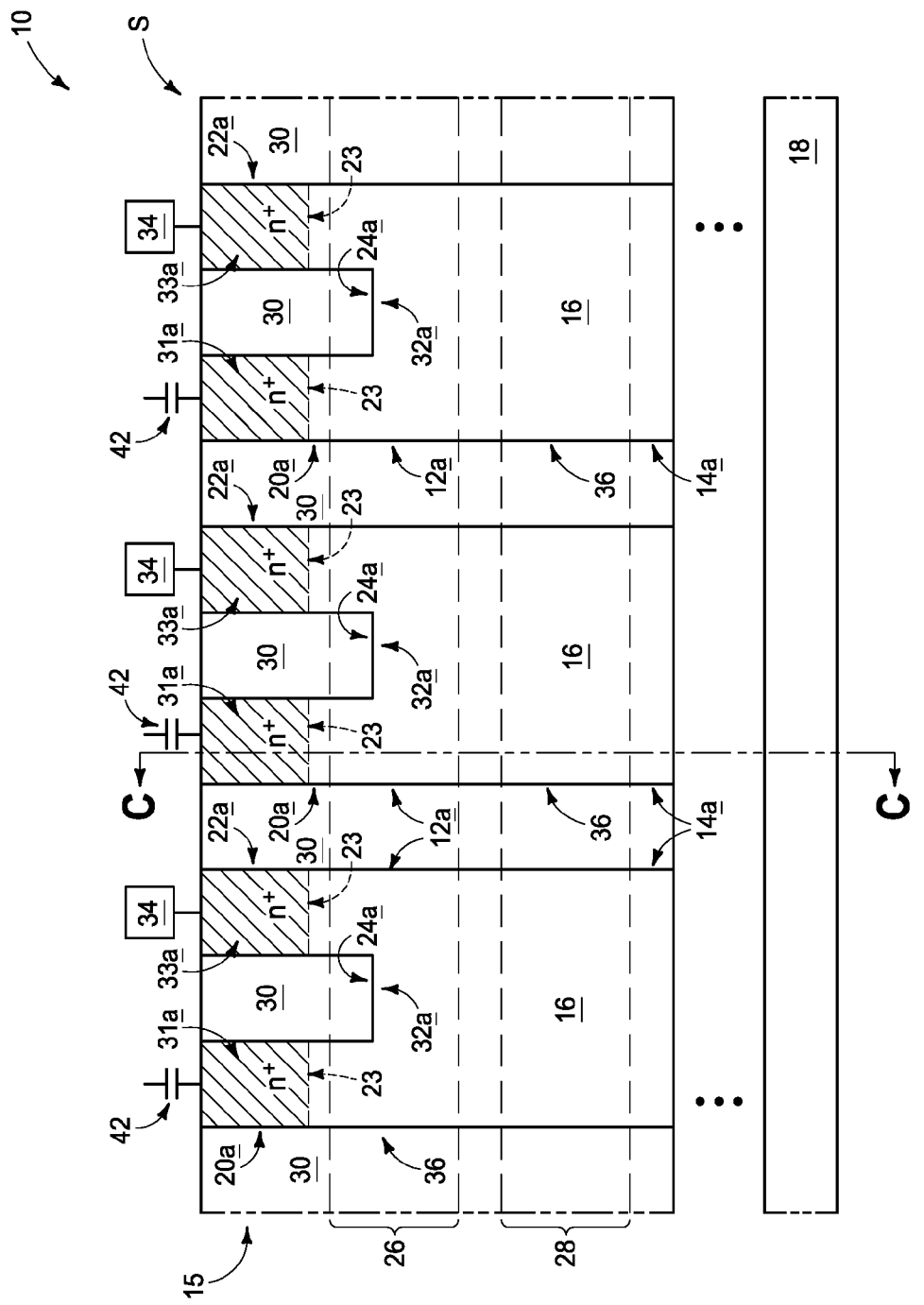

Some embodiments include a memory array having access transistors which comprise fins of semiconductor material. The fins may be arranged along rows of the memory array. The individual fins have first and second pedestals, and a trench (i.e., trough) between the first and second pedestals. A channel region of an access transistor is along the trench, and source/drain regions of the access transistor are along the first and second pedestals. In some embodiments the fin rows are subdivided amongst deep-type (D) rows and shallow-type (S) rows, with the deep-type rows having deeper channel regions than the shallow-type rows. In some embodiments the channel regions along individual fin rows are subdivided amongst deep-type (D) channel regions and shallow-type (S) channel regions. These and other aspects are described with reference to FIGS. 1-21.

A portion of an example memory array 10 is diagrammatically illustrated in FIGS. 1-4. The memory array 10 includes a plurality of finFET transistors (12a and 12b) arranged in rows and columns. Each transistor includes a fin (14a or 14b) of semiconductor material 16. The fins extend upwardly from a substrate 18 (shown in FIGS. 2-4).

The fins 14a comprise a pair of upwardly-extending pedestals 20a and 22a, and have a trench (i.e., valley or trough) 24a between the pedestals 20a/22a. Similarly, the fins 14b comprise a pair of upwardly-extending pedestals 20b and 22b, and have a trench (i.e., valley or trough) 24b between the pedestals 20b/22b. The trenches 24a are shallower than the trenches 24b (or, in other words, the pedestals 20a/22a are shorter than the pedestals 20b/22b). The pedestals 20a/22a/20b/22b may have any suitable dimensions when view top down along the view of FIG. 1 including, for example, F/2, F/4, etc., where F is a minimum feature size of a photolithographic process utilized during fabrication of the pedestals 20a/22a/20b/22b.

The fins 14a extend along first rows 15 of the memory array 10, and the fins 14b extend along second rows 17 of the memory array 10. The rows 15/17 are spaced from one another by gaps 19/21. The gaps 19 space different types of rows from one another (i.e., are between rows 15 and 17), and the gaps 21 space rows of the same type from one another (i.e., are between adjacent rows 15, or are between adjacent rows 17). The gaps 19 may be referred to as first-type gaps, and the gaps 21 may be referred to as second-type gaps to distinguish the gaps 19 and 21 from one another.

The substrate 18 may comprise semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the substrate 18 may correspond to a semiconductor substrate containing one or more materials associated with integrated circuit fabrication. Such materials may include, for example, one or more of refractory metal materials, barrier materials, diffusion materials, insulator materials, etc. The substrate 18 is illustrated to be spaced from fins 14a/14b to indicate that there may be circuitry, materials, levels, etc. (not shown) between the substrate and the fins in some embodiments.

The semiconductor material 16 of fins 14a/14b may comprise any suitable semiconductor material, and in some embodiments may comprise, consist essentially of, or consist of silicon.

The pedestals 20a and 20b comprise first source/drain regions 31a and 31b, respectively, which are heavily doped with n-type dopant (i.e., are shown to be at an n+ dopant level); and the pedestals 22a and 22b comprise second source/drain regions 33a and 33b, respectively, which are heavily doped with the n-type dopant. Dashed lines 23 are provided to diagrammatically illustrate approximate boundaries of the heavily-doped source/drain regions 31a/31b/33a/33b.

The heavy doping may correspond to, for example, a dopant concentration in excess of $10^{20}$ atoms/cm$^3$.

The illustrated finFET transistors 12a/12b are n-type devices in that they comprise n-type doped source/drain regions 31a/31b/33a/33b. In other embodiments doping may be reversed relative to the illustrated doping so that the transistors are p-type devices comprising p-type doped source/drain regions instead of n-type doped source/drain regions.

Lower regions of fins 14a/14b (i.e., regions of the fins 14a/14b beneath the heavily-doped regions 31a/31b/33a/33b of pedestals 20a/20b/22a/22b) may be intrinsically doped. The intrinsic dopant level may correspond to a dopant level of less than or equal to about $10^{15}$ atoms/cm$^3$. In some embodiments, the lower regions of the fins 14a/14b may have p-dopant levels, with such dopant levels corresponding to less than or equal to about $10^{16}$ atoms/cm$^3$.

Figure 4:
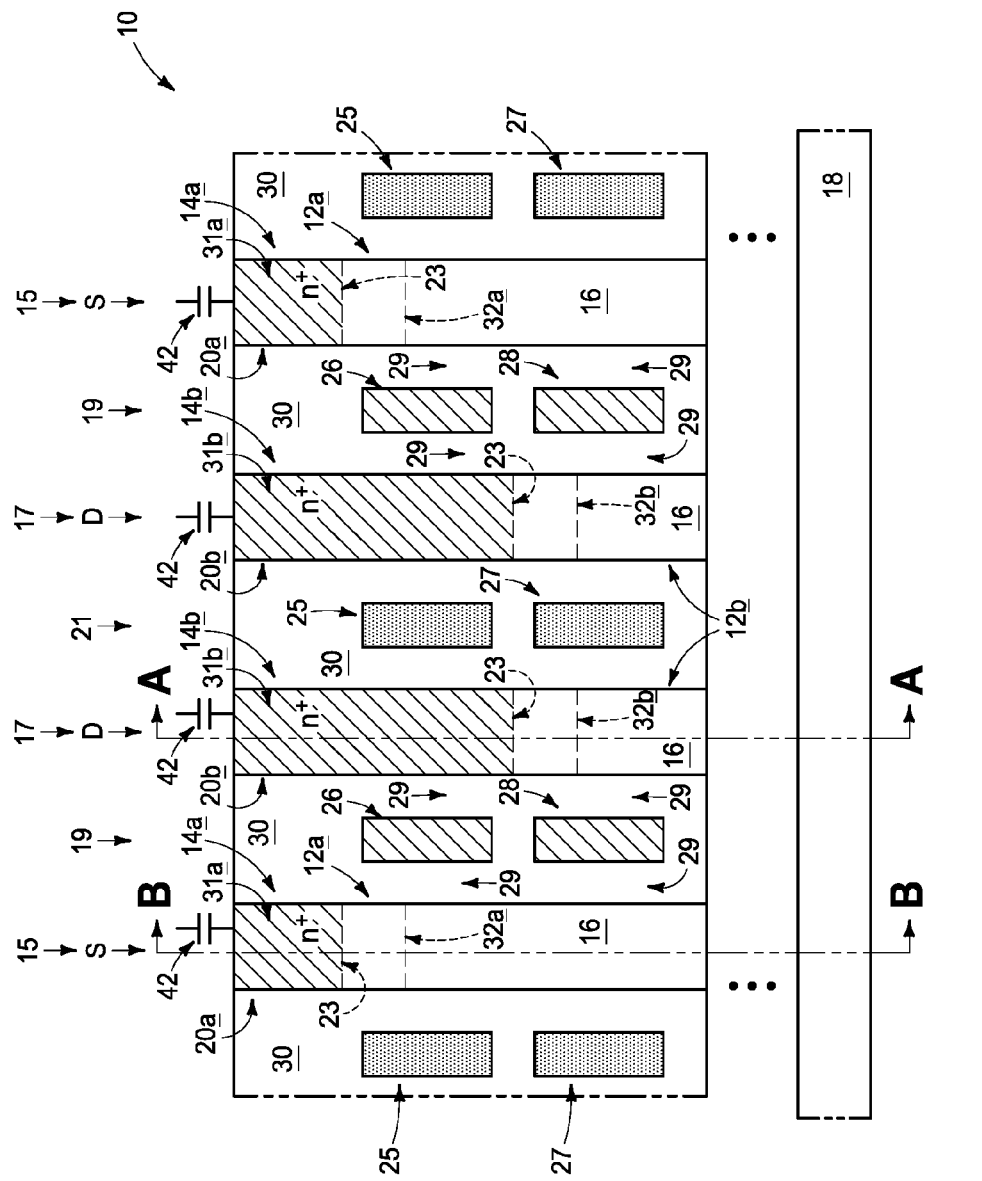
Figure 5:
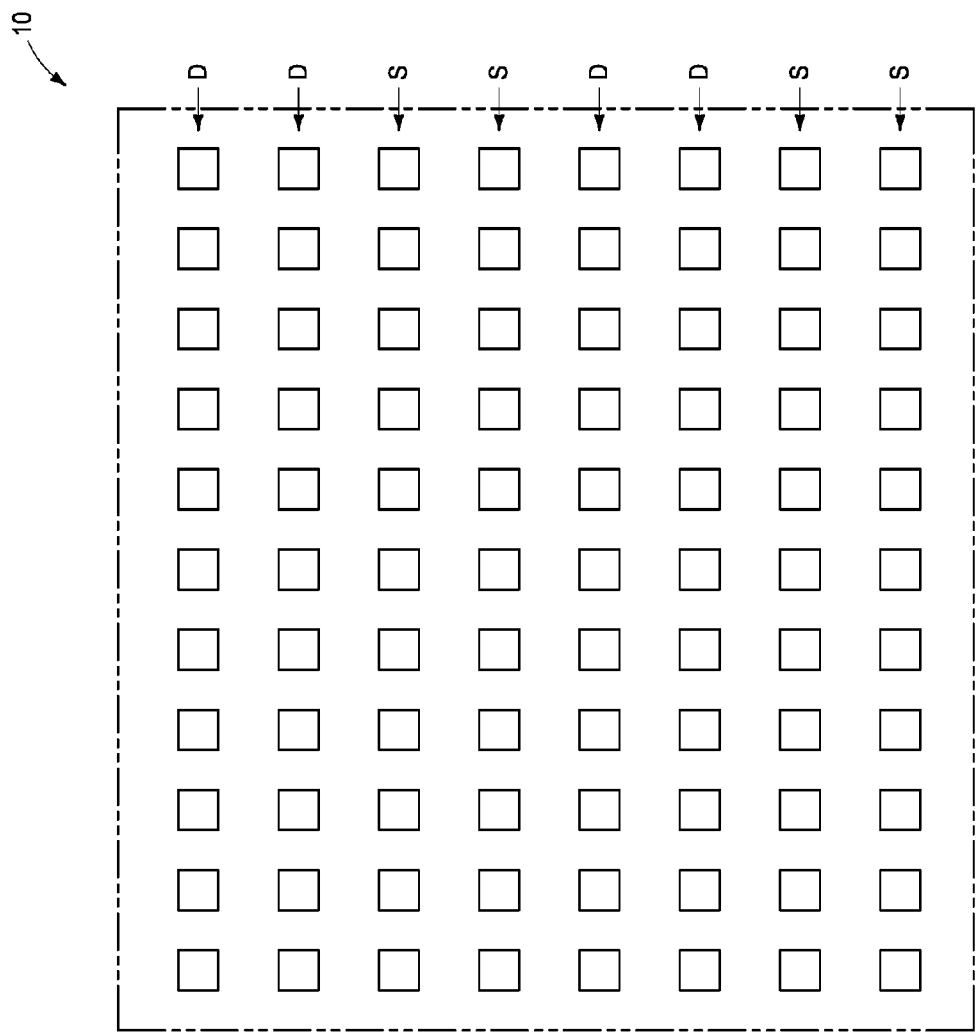
FIG. 5 is a diagrammatic top view the memory array of FIG. 1 showing a larger region than is shown in FIG. 1.
Figure 6:
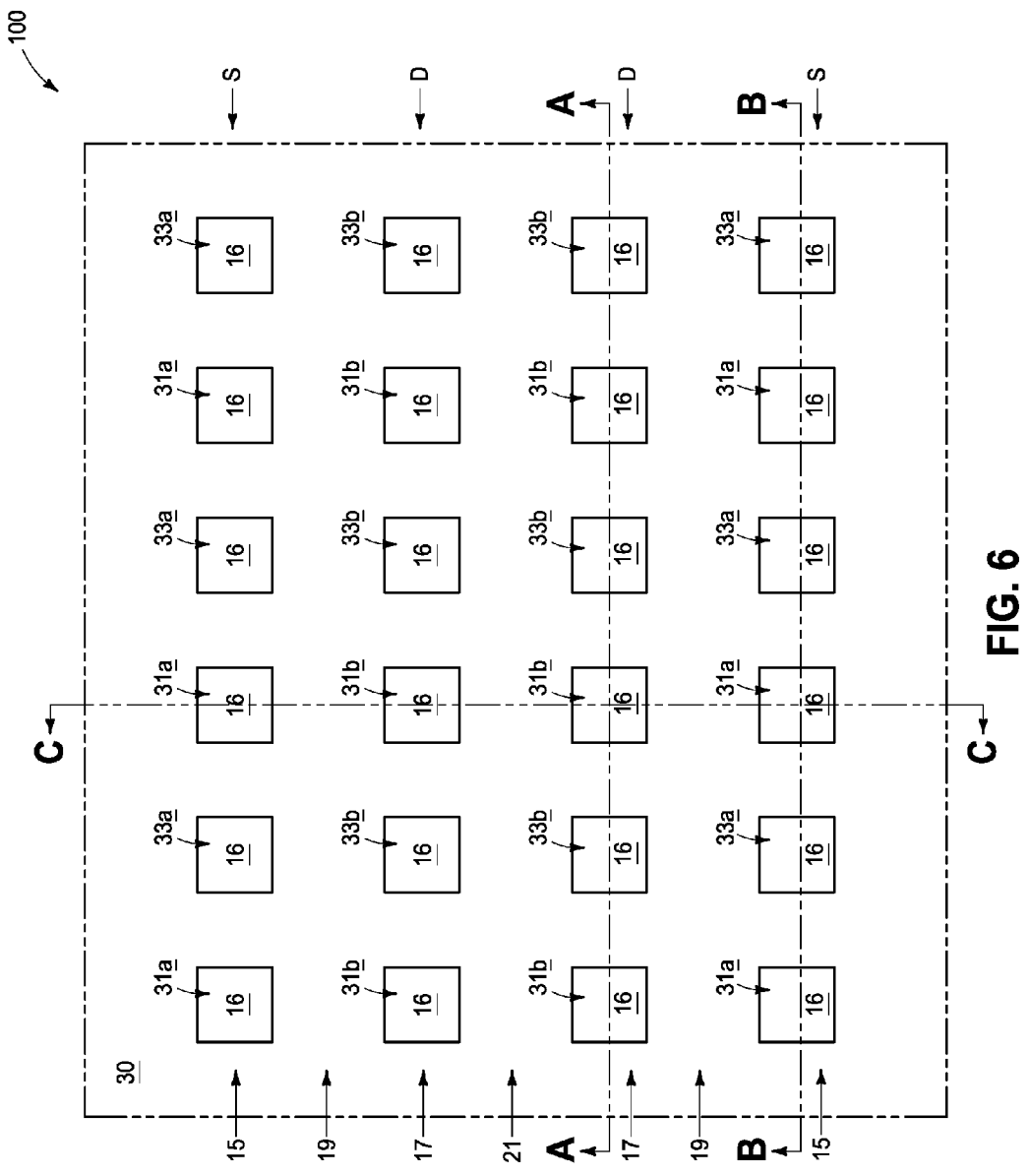
FIGS. 6-9 are a diagrammatic top view and diagrammatic cross-sectional side views of a region of an example memory array. The view of FIG. 7 is along the lines A-A of FIGS. 6 and 9; the view of FIG. 8 is along the lines B-B of FIGS. 6 and 9; and the view of FIG. 9 is along the lines C-C of FIGS. 6, 7 and 8.
Figure 7:
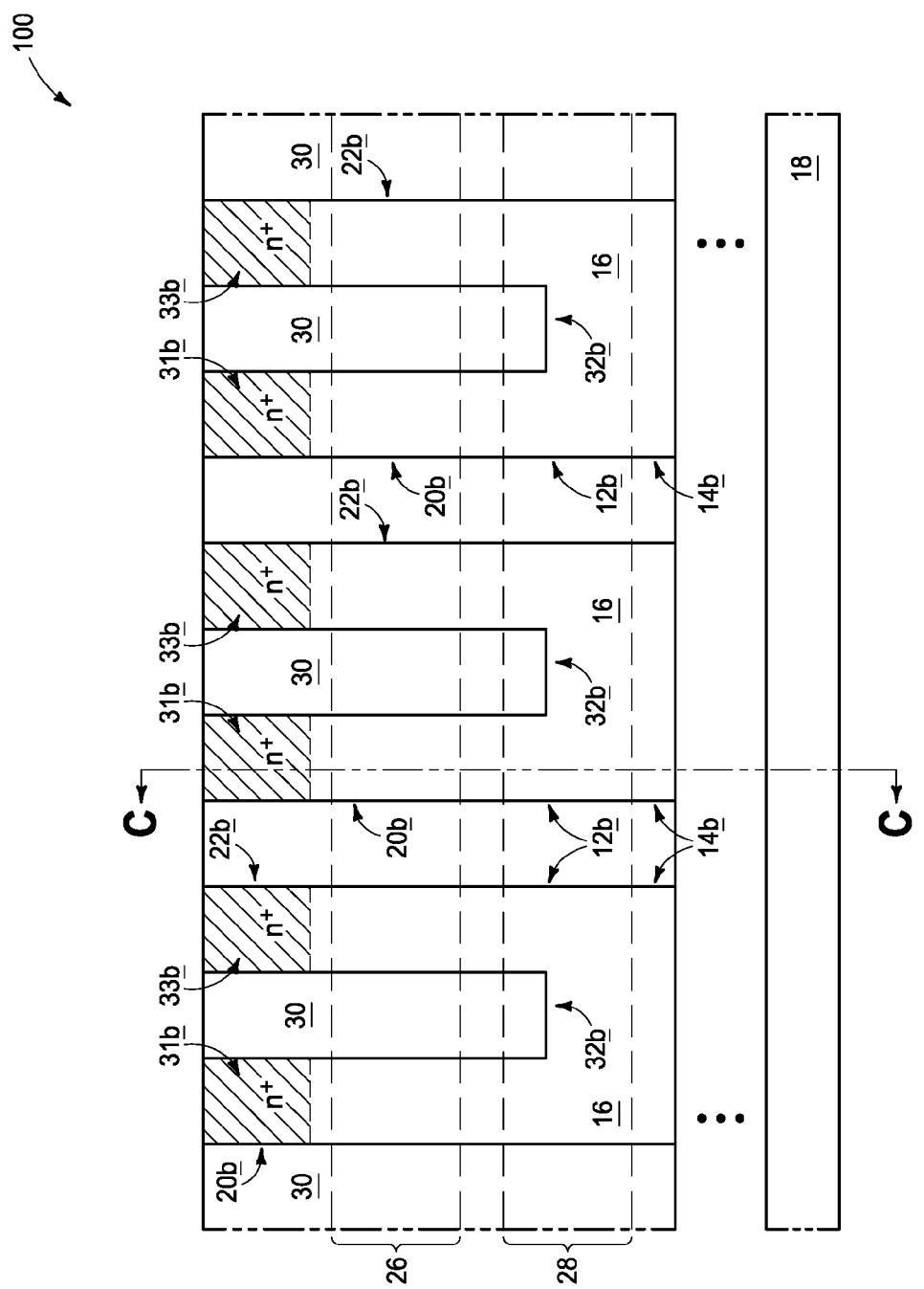
Figure 8:
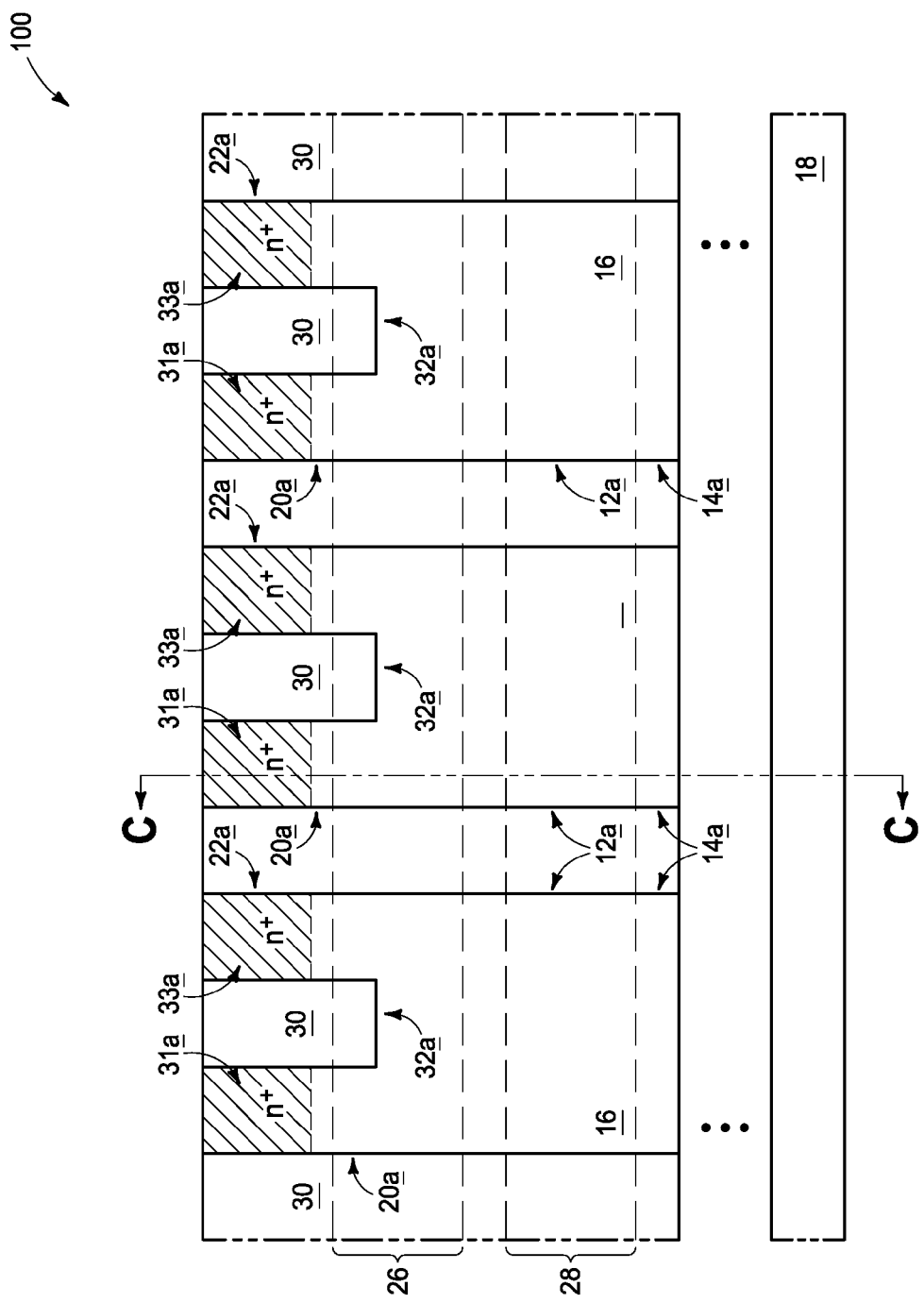
Figure 9:
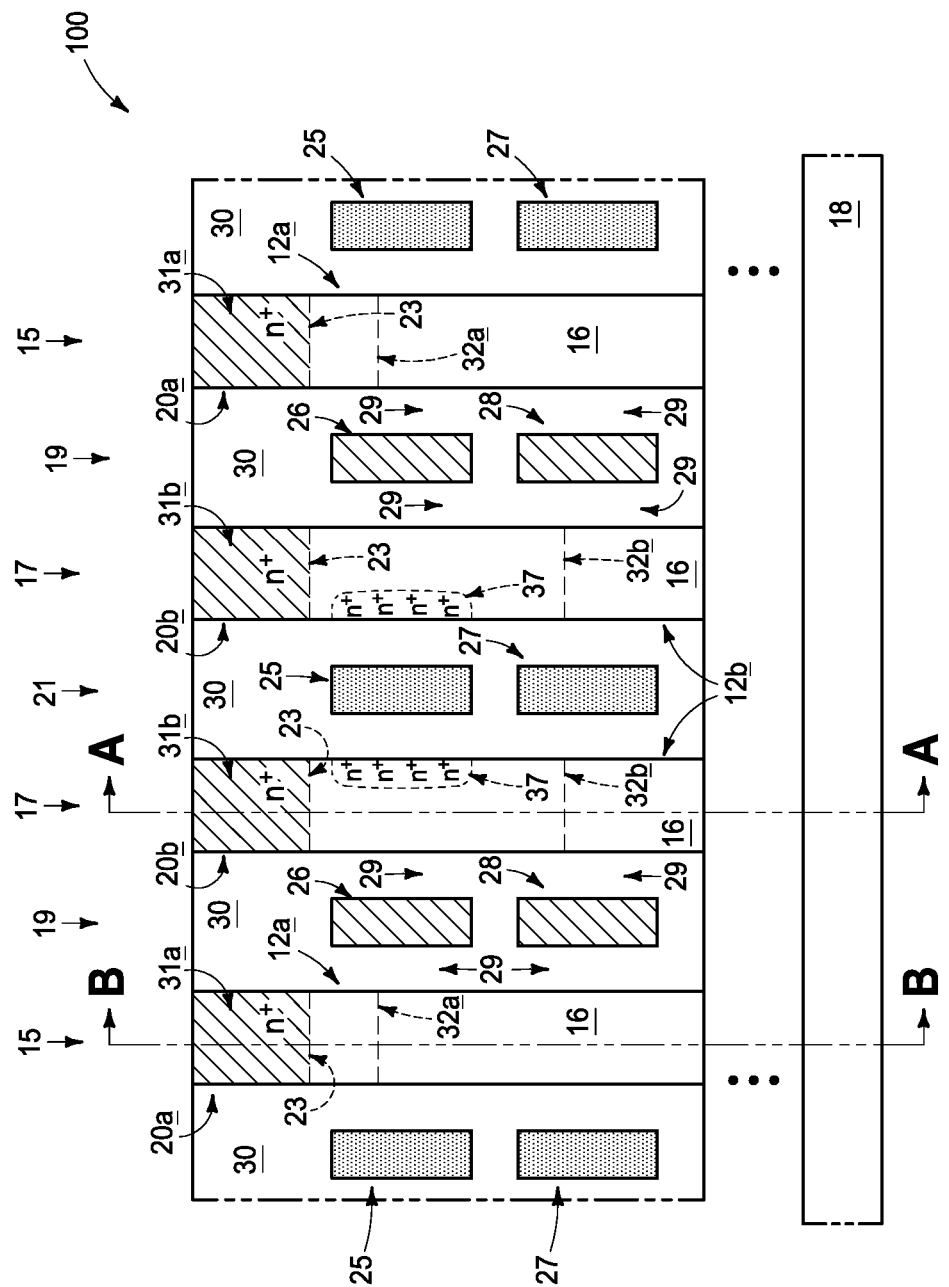

Wordlines 26 and 28 extend along sidewalls of the fins 14a/14b, and are spaced from such sidewalls by gate dielectric material 29. The wordlines 26/28 (as gate electrodes) and gate dielectric 29 are shown in FIG. 4. The wordlines 26/28 are also diagrammatically illustrated in FIGS. 2 and 3 with dashed-lines (i.e., phantom view) since the wordlines 26/28 are out of the plane relative to the views of FIGS. 2 and 3 (specifically, the wordlines 26/28 are behind the cross-section of FIG. 2 and are in front of the cross-section of FIG. 3). The wordlines 26/28 do not overlap the heavily-doped regions of pedestals 26/28 in the illustrated embodiment. In practice, there may be lightly-doped extension regions provided between the heavily-doped regions and other regions of semiconductor material 16 to overlap with the wordlines in this and other embodiments described herein. The lightly-doped extension regions may be implanted regions, diffused regions, redistributed regions and/or may be inversion layers which are formed operationally during operation of gated devices. The lightly doping of the extension regions may correspond to, for example, a dopant concentration ranging from $10^{16}$ atoms/cm$^3$ to $10^{18}$ atoms/cm$^3$.

The wordlines 26 and 28 may be referred to as first and second wordlines, respectively; with the first wordlines 26 being stacked over the second wordlines 28. The first and second wordlines are isolated electrically from one another.

The wordlines may comprise any suitable electrically conductive materials, such as, for example, one or more of various metals (e.g., tungsten, titanium, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The first wordlines 26 may comprise a same composition as the second wordlines 28 in some embodiments, and may comprise different compositions than the second wordlines 28 in other embodiments.

The gate dielectric material 29 may comprise any suitable electrically insulative material, such as, for example, silicon dioxide. In the shown embodiment, the gate dielectric material 29 is shown merging with the other insulative material 30 that surround the fins 14 and other structures (for instance, wordlines 26). Such implies that the gate dielectric material 29 comprises a common composition as the other insulative material 30. In other embodiments, the gate dielectric material 29 may comprise a different composition than at least some of the remaining insulative material 30. Further, although the insulative material 30 is illustrated to be a single homogeneous composition, in other embodiments the insulative material 30 may comprise two or more different compositions.

The wordlines are within the first-type gaps 19. Conductive shielding lines 25 and 27 are within the second-type gaps 21. The conductive shielding lines 25 and 27 may comprise a same composition as the wordlines 26 and 28 in some embodiments, and may comprise different compositions than the wordlines 26 and 28 in other embodiments. For instance, in some embodiments the conductive shielding lines 25/27 may consist of conductively-doped semiconductor material (e.g., n-type doped silicon) while the wordlines 26/28 comprise metal.

In the illustrated embodiment there are two conductive shielding lines (25 and 27) within the second-type gaps, with the first conductive shielding lines 25 being over the second conductive shielding lines 27. The first conductive shielding lines 25 are shown to be at about a same elevational level as the wordlines 26, and the second conductive shielding lines 27 are shown to be at about a same elevational level as the wordlines 28. In other embodiments the paired conductive shielding lines 25/27 within each of the second-type gaps may be replaced with a single conductive shielding line.

The wordlines 26/28 and conductive shielding lines 25/27 may have any suitable width dimensions along the cross-section of FIG. 4; including, for example, F/2, F/4, F/6, etc., where F is a minimum feature size of a lithographic process utilized during fabrication of the wordlines 26/28 and the conductive shielding lines 25/27.

In operation, the conductive shielding lines 25/27 provide electrical isolation between same-type rows (i.e., rows 15/15 or 17/17) on opposing sides of the shielding lines. For instance, FIG. 4 shows shielding lines 25/27 within a center of the illustrated portion of construction 10, with such shielding lines electrically isolating a row 17 on the left side of the shielding lines 25/27 from another row 17 on the right side of the shielding lines 25/27. The shielding lines may be provided with appropriate voltage to obtain the desired electrical isolation.

The wordlines 26 comprise gates of the finFET transistors 12a, and the wordlines 28 comprise gates of the finFET transistors 12b.

Each of the transistors 12a comprises a pair of source/drain regions 31a and 33a, and comprises a channel region 32a (shown in FIG. 3, and diagrammatically illustrated with a dashed line in FIG. 4) extending between the source/drain regions 31a/33a. The upper wordlines 26 overlap the channel regions 32a; and current flow along the channel regions 32a is selectively activated by selectively energizing the upper wordlines 26.

Each of the transistors 12b comprises a pair of source/drain regions 31b and 33b, and comprises a channel region 32b (shown in FIG. 2, and diagrammatically illustrated with a dashed line in FIG. 4) extending between the source/drain regions 31b/33b. The lower wordlines 28 overlap the channel regions 32b; and current flow along the channel regions 32b is selectively activated by selectively energizing the lower wordlines 28.

The channel regions 32a and 32b may be referred to as shallow-type channel regions and deep-type channel regions, respectively, to indicate that the channel regions 32a are placed above (i.e., shallower than) the channel regions 32b. The rows 15 comprising the shallow-type channel regions 32a may be referred to as shallow-type rows, as signified by identifying such rows with the label "S". Similarly, the rows 17 comprising the deep-type channel regions 32b may be referred to as deep-type rows, as signified by identifying such rows with the label "D". The D and S rows are in an arrangement -S-D-D-S- along the illustrated portion of memory array 10 within FIGS. 1-4. A larger portion of the memory array 10 is illustrated in top-view in FIG. 5 to show that the pattern of the D and S rows includes an arrangement -S-S-D-D-S-S-D-D-. The hyphens on the opposing sides of the specified arrangement are utilized to indicate that additional rows may be provided on either side of the specified portion of the arrangement to continue repeating the pattern of the arrangement across a memory array.

Referring again to FIGS. 1-4, digit lines 34 are electrically coupled with the second source/drain regions 33a/33b of the transistors 12a/12b. The digit lines 34 are shown in phantom view in FIG. 1 to indicate that they are above the plane of the FIG. 1 view, and are diagrammatically illustrated with boxes in FIGS. 2 and 3. The digit lines 34 may comprise any suitable electrically conductive materials; such as, for example, conductively-doped semiconductor material (for instance, conductively-doped silicon, conductively-doped germanium, etc.), metal (for instance, tungsten, titanium, cobalt, etc.) and/or metal-containing composition (for instance, metal silicide, metal nitride, etc.).

In the shown embodiment top surfaces of the pedestals 22a are positioned on a same plane (i.e., are a same height) as top surfaces of the pedestals 20a, and similarly top surfaces of the pedestals 22b are positioned on a same plane (i.e., are a same height) as top surfaces of the pedestals 20b. Accordingly, the digit lines 34 extend across an upper surface of the illustrated portion of memory array 10. In other embodiments (not shown) the pedestals 22a/22b may be recessed relative to the pedestals 20a/20b, and accordingly the digit lines 34 may be recessed beneath the illustrated upper surface of memory array 10.

Charge-storage devices 42 are electrically coupled with the first source/drain regions 31a/31b. The charge-storage devices 42 may correspond to any components suitable for reversibly storing charge. In the illustrated embodiment the charge-storage devices 42 are capacitors. The capacitors may have any suitable configuration, and may comprise any suitable materials. The charge-storage devices (e.g., capacitors) 42 are shown in phantom view in FIG. 1 to indicate that they are above the plane of the FIG. 1 view. In other embodiments the charge-storage devices 42 may be charge trap devices, ferroelectric devices, magnetic devices or resistive change devices.

The combination of an access transistor 12 with a charge-storage device (e.g., capacitor) 42 forms a memory cell 36, with a charge state of the charge-storage device 42 corresponding to a memory state of the memory cell 36. The memory cells are arranged in rows and columns across the memory array 10. The wordlines 26/28 extend along rows of the memory cells 36 within the memory array 10, and the digit lines 34 extend along columns of the memory cells 36 within the memory array 10.

The embodiment of FIGS. 1-4 has the source/drain regions 31b/33b of the transistors 12b (i.e., the transistors having the deep channel regions 32b) extending below (i.e., deeper than) the source/drain regions 31a/33a of the transistors 12a (i.e., the transistors having the shallow channel regions 32a). In other words, the source/drain regions 31b/33b extend below the shallow channel regions 32a of the transistors 12a. Such embodiment may require a separate mask to be utilized during a dopant implant into source/drain regions 31b/33b than is utilized during a dopant implant into source/drain regions 31a/33a. FIGS. 6-9 illustrate a region of a memory array 100 showing an alternative embodiment in which all of the source/drain regions 31a/31b/33a/33b have dopant implanted to a same depth. The digit lines 34 (FIGS. 1-4) and charge-storage devices 42 (FIGS. 1-4) are not shown in FIGS. 6-9 in order to simplify the drawings, but it is to be understood that such structures may be present in the memory array 100 of FIGS. 6-9.

The transistors 12a of FIGS. 6-9 may be operated identically to the transistors 12a of FIGS. 1-4. Specifically, the upper wordlines 26 overlap the channel regions 32a of the transistors 12a; and current flow along the channel regions 32a is selectively activated by selectively energizing the upper wordlines 26.

In contrast, the transistors 12b of FIGS. 6-9 are operated somewhat differently than the transistors 12b of FIGS. 1-4. Specifically, the conductive lines 25 which had simply been "shielding lines" in the embodiment of FIGS. 1-4 are now utilized to form dopant-enhanced regions 37 (diagrammatically illustrated in FIG. 9 along the pedestals 20b) that serve as the doped regions for a duration in which a lower wordline 28 is selectively activated. The dopant-enhanced regions 37 may enable current flow along regions of the tall pedestals 20b/22b when channel regions 32b are selectively activated with lower wordlines 28.

The dopant-enhanced regions 37 may be formed with any suitable operation of conductive lines 25. For instance, in some embodiments the conductive lines 25 may be utilized as conductive plates, as transistor gates, etc. in order to generate dopant-enhanced regions 37 within the pedestals 20b/22b adjacent the conductive lines 25. In the shown embodiment the dopant-enhanced regions 37 comprise n-type dopant. In other embodiments the dopant-enhanced regions may instead comprise p-type dopant. The dopant-enhanced regions 37 are shown at an $n^+$ (i.e., heavily n-type doped) conductivity level. In other embodiments the dopant-enhanced regions may be at any other suitable conductivity levels.

The embodiments of FIGS. 1-9 have the fin rows 15/17 subdivided amongst the deep-type (D) rows 17 and shallow-type (S) rows 15, with the deep-type rows having deep channel regions 32b and the shallow-type rows having shallow channel regions 32a. In other embodiments the channel regions along individual fin rows are subdivided amongst deep-type (D) channel regions and shallow-type (S) channel regions, with the deep-type channel regions being placed below (i.e., deeper than) the shallow-type channel regions. Examples of such other embodiments are described with reference to FIGS. 10-21.

Figure 10:
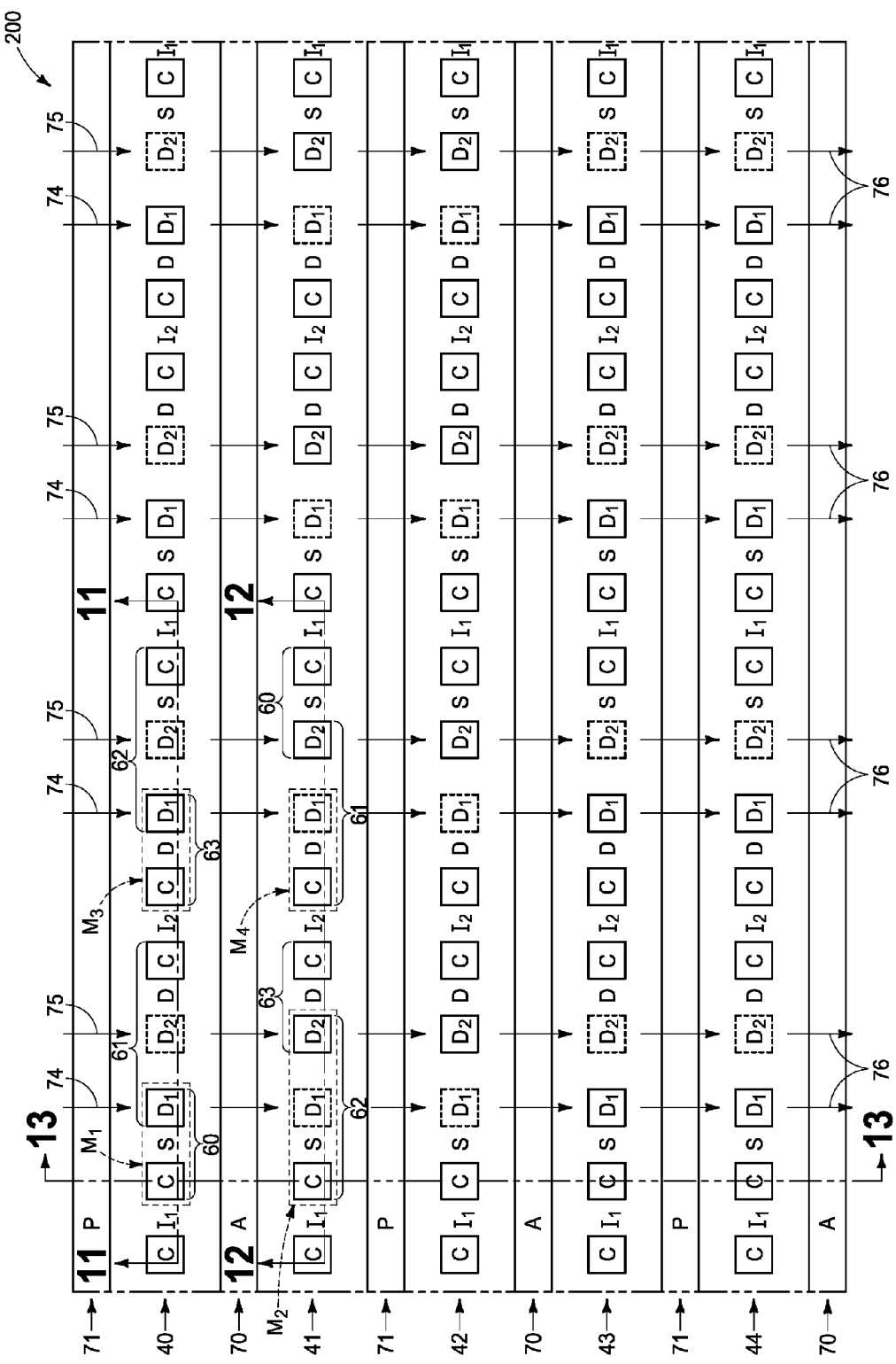
Figure 13:
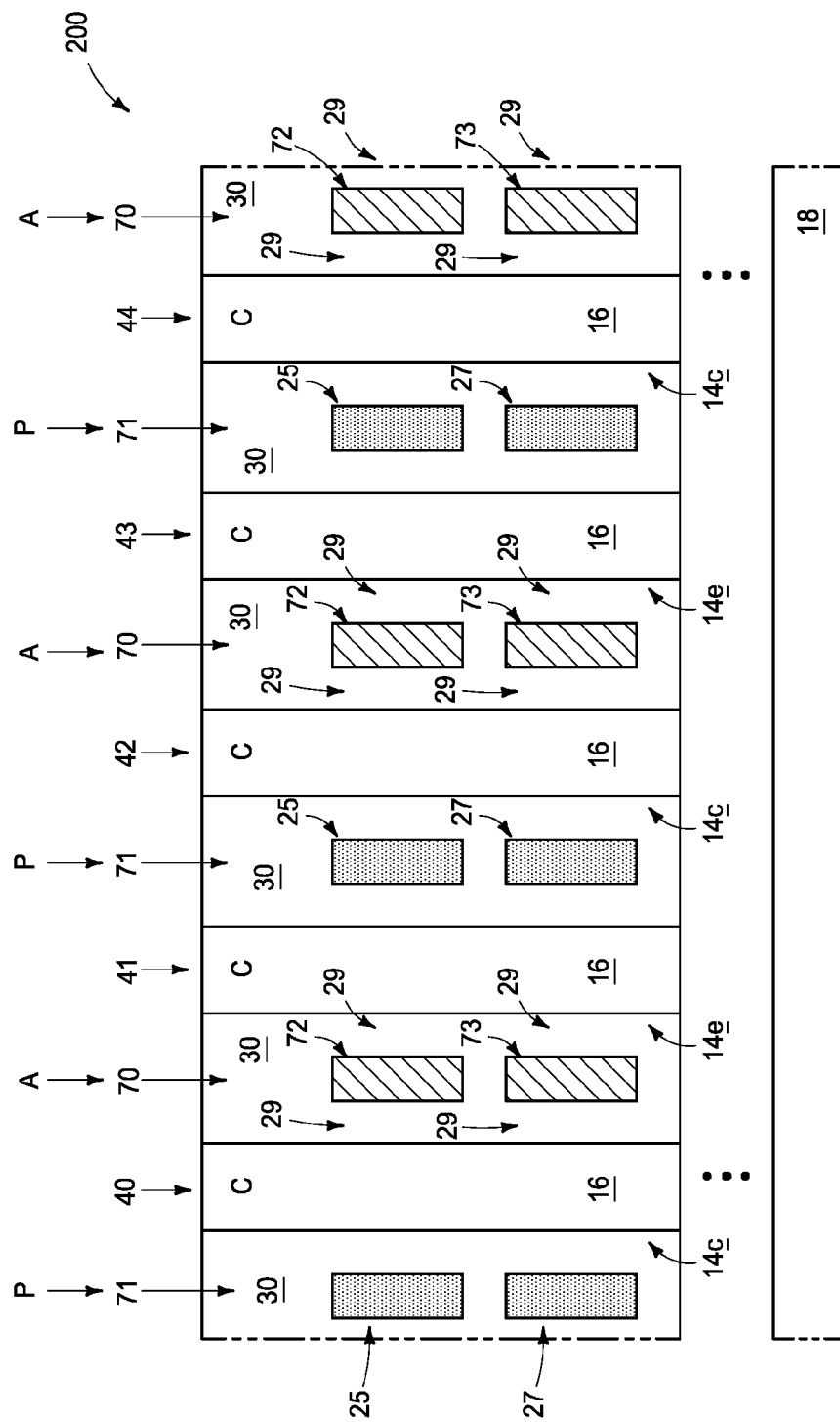

FIGS. 10-13 illustrate a portion of an example memory array 200; with the cross-sectional views of FIGS. 11-13 being expanded relative to the top view of FIG. 10 in order to better show some of the illustrated structures.

The memory array 200 includes a plurality of rows 40-44. The rows comprise fins 14c, 14d, 14e and 14f in various arrangements (fins 14c, 14d, 14e and 14f are only labeled in the cross-sectional views of FIGS. 11-13, and not in the top view of FIG. 10 in order to simplify the top view of FIG. 10).

FIGS. 11 and 12 are cross-sections along regions of rows 40 and 41 and illustrate the fins 14c, 14d, 14e and 14f in cross-sectional side views. The fins 14c, 14d, 14e and 14f each include two transistors. It is noted that fins 14e and 14f are substantially mirror images of fins 14d and 14c, respectively; with the term "substantially mirror image" meaning a mirror image to within reasonable tolerances of fabrication and measurement. Each of the fins 14c-f comprises the semiconductor material 16, and extends upwardly from the substrate 18 (shown in FIGS. 11-13).

The fins 14c, 14d, 14e and 14f are spaced from one another by regions comprising insulative material 30, and labeled as $I_1$ or $I_2$. The insulative material 30 within regions $I_1$ and $I_2$ may comprise any suitable electrically insulative composition or combination of compositions; such as, for example silicon dioxide, silicon nitride, etc. The labels $I_1$ and $I_2$ are used to indicate relative locations (i.e., the regions identified by the label $I_1$ alternate with the regions identified by the label $I_2$ along the rows 40-44) rather than to indicate chemical or other differences between materials within the regions identified as $I_1$ and $I_2$.

Each of the fins 14c-14f of FIGS. 10-13 may be considered to comprise three upwardly-extending pedestals (with fins 14c and 14f comprising pedestals 50, 51 and 52; and with fins 14d and 14e comprising pedestals 53, 54 and 55). Each of the fins 14c-f also comprises two trenches (with fins 14c and 14f comprising trenches (i.e., troughs) 56 and 57; and with fins 14d and 14e comprising trenches (i.e., troughs) 58 and 59). The trenches 56 of fins 14c and 14f are shallow, and the trenches 57 of fins 14c and 14f are deep (with the terms "shallow" and "deep" being used relative to one another, and meaning that trenches 56 relatively shallow as compared to trenches 57; and conversely that trenches 57 are relatively deep as compared to trenches 56). Similarly, the trenches 59 of fins 14d and 14e are shallow, and the trenches 58 of fins 14d and 14e are deep.

FinFET transistors 60 comprise the shallow trenches 56 together with the pedestals 50 and 51; and finFET transistors 61 comprise the deep trenches 57 together with the pedestals 51 and 52. Similarly finFET transistors 62 comprise the shallow trenches 59 together with the pedestals 54 and 55; and finFET transistors 63 comprise the deep trenches 58 together with the pedestals 53 and 54.

It is noted that each fin comprises a pedestal shared between two finFET transistors (specifically, the pedestals 51 are shared by the finFET transistors 60 and 61; and the pedestals 54 are shared by the finFET transistors 62 and 63).

The pedestals 50, 52, 53 and 55 comprise source drain regions 64 which are ultimately electrically coupled to charge-storage devices (e.g., capacitors). The source/drain regions 64 are at upper regions of the pedestals 50, 52, 53 and 55, and are labeled with a C to indicate that they are to be electrically coupled to capacitors or other suitable charge-storage devices. The pedestals 51 and 54 comprise source drain regions 65 which are electrically coupled with digit lines, and which are shown electrically coupled with structures $D_1$ and $D_2$. The structures $D_1$ and $D_2$ are each digit line components, and adjacent structures $D_1$ and $D_2$ together operate as a digit line configuration as discussed in more detail below.

The digit line components $D_1$ and $D_2$ may comprise any suitable electrically conductive materials. In the illustrated embodiment the digit line components $D_1$ and $D_2$ comprise a first conductive material 101 under a second conductive material 102. The first conductive material 101 may comprise, for example, conductively-doped semiconductor material (e.g., conductively-doped silicon, conductively-doped germanium, etc.). The second conductive material 102 may comprise, for example, one or more of various metals (e.g., titanium, cobalt, nickel, platinum, etc.) and/or metal-containing compositions (e.g., metal silicide, metal nitride, metal carbide, etc.); and may, for example, comprise titanium over titanium silicide.

The source/drain regions 64 and 65 may comprise heavily-doped regions (for instances, $n^+$-doped regions) analogous to the source/drain regions 31a/31b/33a/33b of FIGS. 1-4.

The fins 14a/14b discussed above with reference to FIGS. 1-4 are indicated to comprise first pedestals 20a/20b having first source/drain regions 31a/31b electrically coupled with charge-storage devices 42, and to comprise second pedestals 22a/22b having second source/drain region 33a/33b electrically coupled with digit lines 34. The fins 14c/14f may be considered to each comprise two first pedestals 50/52 having first source/drain regions 64 electrically coupled with charge-storage devices (with such coupling being indicated by the label "C"), and to comprise second pedestals 51 having second source/drain regions 65 electrically coupled with digit line components $D_1$ and $D_2$. Similarly, the fins 14d/14e may be considered to each comprise two first pedestals 53/55 having first source/drain regions 64 electrically coupled with charge-storage devices (with such coupling being indicated by the label "C"), and to comprise second pedestals 54 having second source/drain regions 65 electrically coupled with digit line components $D_1$ and $D_2$.

The finFET transistor 60 comprises a channel region 66 along the trench (i.e., trough) 56, and the finFET transistor 61 comprises a channel region 67 along the trench (i.e., trough) 57. The channel region 67 extends below (i.e., deeper than) the channel region 66. Accordingly, the channel region 66 may be referred to as a shallow-type channel region, and the channel region 67 may be referred to as a deep-type channel region. The label "S" is utilized to indicate the shallow-type channel region, and the label "D" is utilized to indicate the deep-type channel region. The finFET transistor 62 has a shallow-type channel region 69 along the trench (i.e., trough) 59, and the finFET transistor 63 has a deep-type channel region 68 along the trench (i.e., trough) 58.

The top view of FIG. 10 shows that channel regions along individual rows are subdivided amongst deep-type (D) channel regions and shallow-type (S) channel regions. The D channel regions and S channel regions are in an arrangement -S-S-D-D-S-S-D-D- along each row of fins. The hyphens on the opposing sides of the specified arrangement are utilized to indicate that the pattern of the specified arrangement may continue on either side of the specified arrangement, to continue repeating the pattern along a row of the memory array 200.

The rows 40-44 of the memory array 200 are spaced from one another by alternating gaps 70 and 71. The gaps 70 are labeled A to indicate that they contain active wordline components, and the gaps 71 are labeled P to indicate that they contain passive conductive components (i.e., shielding components). The gaps 70 may be referred to as first-type gaps, and the gaps 71 may be referred to as second-type gaps to distinguish the gaps 70 and 71 from one another.

First and second wordline components 72 and 73 are within the first-type gaps 70; with the first wordline components (as first gate electrodes) 72 being stacked over the second wordline components (as second gate electrodes) 73. The wordline components 72/73 extend along sidewalls of the fins 14*c-f*, and are spaced from such sidewalls by gate dielectric material 29. The wordline components 72/73 and the gate dielectric material 29 are shown in FIG. 13. The wordline components 72/73 are also diagrammatically illustrated in FIGS. 11 and 12 with dashed-lines (i.e., phantom view) since the wordline components 72/73 are out of the plane relative to the views of FIGS. 11 and 12 (and specifically the wordline components 72/73 are in front of the plane of the FIG. 11 view, and behind the plane of the FIG. 12 view).

The wordline components 72/73 may comprise any suitable electrically conductive materials, such as, for example, one or more of various metals (e.g., tungsten, titanium, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The first wordline components 72 may comprise a same composition as the second wordline components 73 in some embodiments, and may comprise different compositions than the second wordline components 73 in other embodiments.

The gate dielectric material 29 may comprise any suitable electrically insulative material, such as, for example, silicon dioxide. In the shown embodiment, the gate dielectric material 29 is shown merging with other insulative material 30. Such implies that the gate dielectric material 29 comprises a common composition as the other insulative material 30. In other embodiments, the gate dielectric material 29 may comprise a different composition than at least some of the remaining insulative material 30. Further, although the insulative material 30 is illustrated to be a single homogeneous composition, in other embodiments the insulative material 30 may comprise two or more different compositions.

Conductive shielding lines 25 and 27 are within the second-type gaps 71. The conductive shielding lines 25 and 27 may comprise a same composition as the wordline components 72 and 73 in some embodiments, and may comprise different compositions than the wordline components 72 and 73 in other embodiments. For instance, in some embodiments the conductive shielding lines 25/27 may consist of conductively-doped semiconductor material while the wordline components 72/73 comprise metal. The conductive shielding lines 25/27 may have less stringent operational requirements than the wordline components 72/73. Accordingly, metal may be used for the wordline components 72/73 to advantageously provide reduced resistance and rapid response across the wordline components 72/73 as desired for some applications, and the doped semiconductor material may be used for conductive shielding lines 25/27 to simplify fabrication of the conductive shielding lines and reduce fabrication costs of the conductive shielding lines 25/27.

In the illustrated embodiment there are two conductive shielding lines (25 and 27) within the second type gaps, with the first conductive shielding lines 25 being over the second conductive shielding lines 27. The first conductive shielding lines 25 are shown to be at about a same elevational level as the first wordline components 72, and the second conductive shielding lines 27 are shown to be at about a same elevational level as the second wordline components 73. In other embodiments the paired conductive shielding lines 25/27 within each of the second-type gaps 71 may be replaced with a single conductive shielding line.

In operation, the conductive shielding lines 25/27 may provide electrical isolation between rows on opposing sides of the conductive shielding lines. The conductive shielding lines may be provided with appropriate voltage to obtain the desired electrical isolation.

The upper wordline components 72 comprise gates across the shallow-type channel regions 66 and 69, and thus gate the finFET transistors 60 and 62. The deep wordline components 73 comprise gates across the deep-type channel regions 67 and 68, thus gate the finFET transistors 61 and 63.

A few of the access transistors 60, 61, 62 and 63 are labeled in the top view of FIG. 10 so that operation of the memory array 200 may be more readily described. Each access transistor (60, 61, 62 or 63) may be utilized to electrically couple a charge-storage device (C) with a digit line component ($D_1$ or $D_2$). For instance, if the upper wordline component 72 is activated within the gap 70, such will activate access transistors 60 and 62 (i.e., access transistors having shallow-type channel regions) along both of rows 40 and 41. A memory cell associated with an access transistor 60 in row 40 is designated as memory cell $M_1$, and a memory cell associated with an access transistor 62 in row 41 is designated as memory cell $M_2$. Note that if a single digit line passed across rows 40 and 41, the memory cells $M_1$ and $M_2$ could not be distinguished from one another. However, by utilizing two digit line components ($D_1$ and $D_2$), the memory cells $M_1$ and $M_2$ may be uniquely addressed in that the memory cell $M_1$ utilizes digit line component $D_1$ while the memory cell $M_2$ utilizes digit line component $D_2$. The two digit line components ($D_1$ and $D_2$) may configure a folded-bitline architecture.

The lower wordline component 73 within gap 70 may be utilized to activate access transistors 61 and 63 (i.e., access transistors having deep-type channel regions) within both of rows 40 and 41. The utilization of two digit line components ($D_1$ and $D_2$) enables a memory cell $M_3$ along the row 40 to be distinguished from a memory cell $M_4$ along row 41.

The memory cells $M_1$, $M_2$, $M_3$ and $M_4$ are a few of the many memory cells arranged in rows and columns across array 200. All of the memory cells within the memory array 200 (e.g., memory cells $M_1$, $M_2$, $M_3$ and $M_4$) may be uniquely addressed through utilization of a wordline component (72/73) and a digit line component ($D_1/D_2$).

The conductive lines 72 and 73 of the embodiment of FIGS. 10-13 are referred to as wordline components, rather than as wordlines, because the conductive lines 72 and 73 are utilized in tandem for operation access transistors in two different rows. Similarly, the lines $D_1$ and $D_2$ are referred to as digit line components because the lines $D_1$ and $D_2$ are utilized in tandem during operation of columns. In other words, wordlines are distinguished from wordline components in that wordlines are utilized for operation of entire rows of access transistors whereas wordline components are utilized in tandem for operation of two rows of access transistors that are on opposing sides of the wordline components; and digit lines are distinguished from digit line components in that digit lines are utilized during operation of entire columns, whereas digit line components are utilized in tandem for shared operation of a column.

Laterally adjacent digit line components $D_1$ and $D_2$ may be considered to form a digit line configuration 76. Arrows 74 are provided to diagrammatically illustrate the orientation of the digit line components $D_1$ across the memory array 200, and arrows 75 are provided to diagrammatically illustrate the orientation of the digit line components $D_2$ across the memory array 200. Together, the arrows 74 and 75 diagrammatically illustrate the orientation of digit line configurations 76 across the memory array. The digit line configurations 76 extend along columns of the memory array 200. Each memory cell (e.g., $M_1$, $M_2$, $M_3$ and $M_4$) utilizes only one of the digit line components $D_1$ and $D_2$. Such is indicated in FIG. 10 (and also FIG. 17 which is discussed below) with solid squares and dashed squares. Solid squares are provided around the digit line components $D_1/D_2$ utilized by individual memory cells (e.g., $M_1$, $M_2$, $M_3$ and $M_4$), and dashed squares are provided around the digit lines $D_1/D_2$ not utilized by the individual memory cells (e.g., $M_1$, $M_2$, $M_3$ and $M_4$).

In the embodiment of FIGS. 10-13, the digit line configurations 76 are substantially straight lines extending along a direction substantially orthogonal to a direction of the rows 40-44. The term "substantially straight" means straight to within reasonable tolerances of fabrication and measurement; and the term "substantially orthogonal" means orthogonal to within reasonable tolerances of fabrication and measurement.

Figure 16:
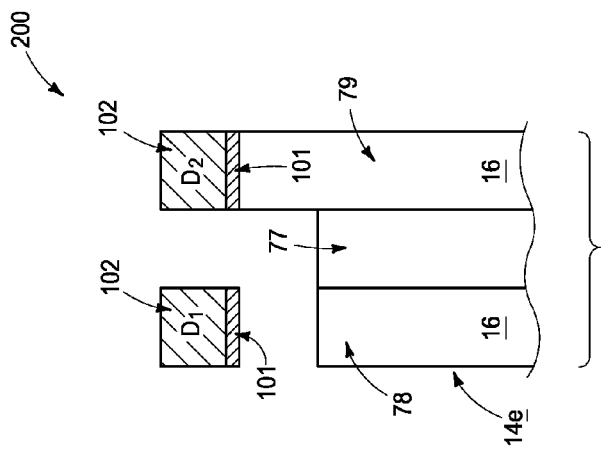
FIGS. 14-16 are diagrammatic cross-sectional side views of a region of a construction at various process stages of an example method of forming a portion of an example memory array.
Figure 15:
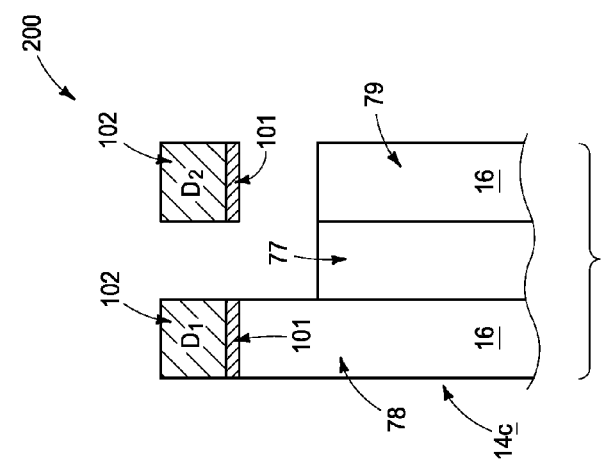

The digit line components $D_1$ and $D_2$ of memory array 200 may be fabricated with any suitable methodology. For instance, FIGS. 14-16 illustrate an example method of utilizing aligned spacers for fabrication of the digit components $D_1$ and $D_2$.

Figure 14:
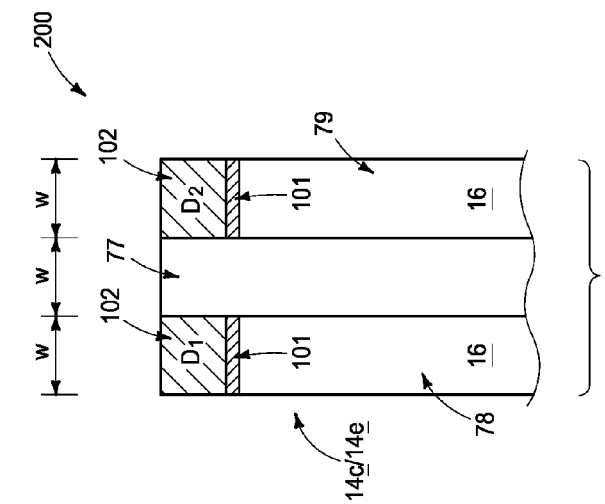

Referring to FIG. 14, a region of memory array 200 is shown at a processing stage in which a spacer 77 is fabricated and utilized to align with pedestals 78 and 79 of a fin 14c/14e. Notably, the spacer 77 and the pedestals 78 and 79 all have about the same width dimension "W". Such dimension may be any suitable dimension including, for example, F/2, F/4, etc., where "F" is a minimum feature size of a lithographic process utilized during fabrication of the various structures of array 200.

The pedestals 78 and 79 comprise semiconductor material 16.

The spacer 77 may comprise any suitable material, including, for example, silicon dioxide, silicon nitride, etc.

Digit line components $D_1$ and $D_2$ are formed over pedestals 78 and 79, and aligned with the spacer 77.

Referring to FIG. 15, an etch is utilized to remove a portion of spacer 77 and some of the material from region 79 of fin 16 to thereby form a structure of the type shown in FIG. 11 for the fin 14c. Alternatively, and referring to FIG. 16, the etch is instead utilized to move the portion of spacer 77 and some of the material from region 78 of fin 16 to thereby form a structure of the type shown in FIG. 12 for the fin 14e.

The configuration of FIGS. 10-13 is an example configuration suitable for utilization of digit line components and wordline components in addressing memory cells of a memory array. Another example configuration is described with reference to a memory array 300 in FIGS. 17-19; with the cross-sectional views of FIGS. 18 and 19 being expanded relative to the top view of FIG. 17 in order to better show some of the illustrated structures.

The memory array 300 includes rows 40-44 comprising fins 14c, 14d, 14e and 14f similar to those described above with reference to FIGS. 10-13. The fins 14e and 14f of memory array 300, like those of the memory array 200 (FIGS. 10-13) are substantially mirror images of fins 14d and 14c, respectively.

Figure 17:
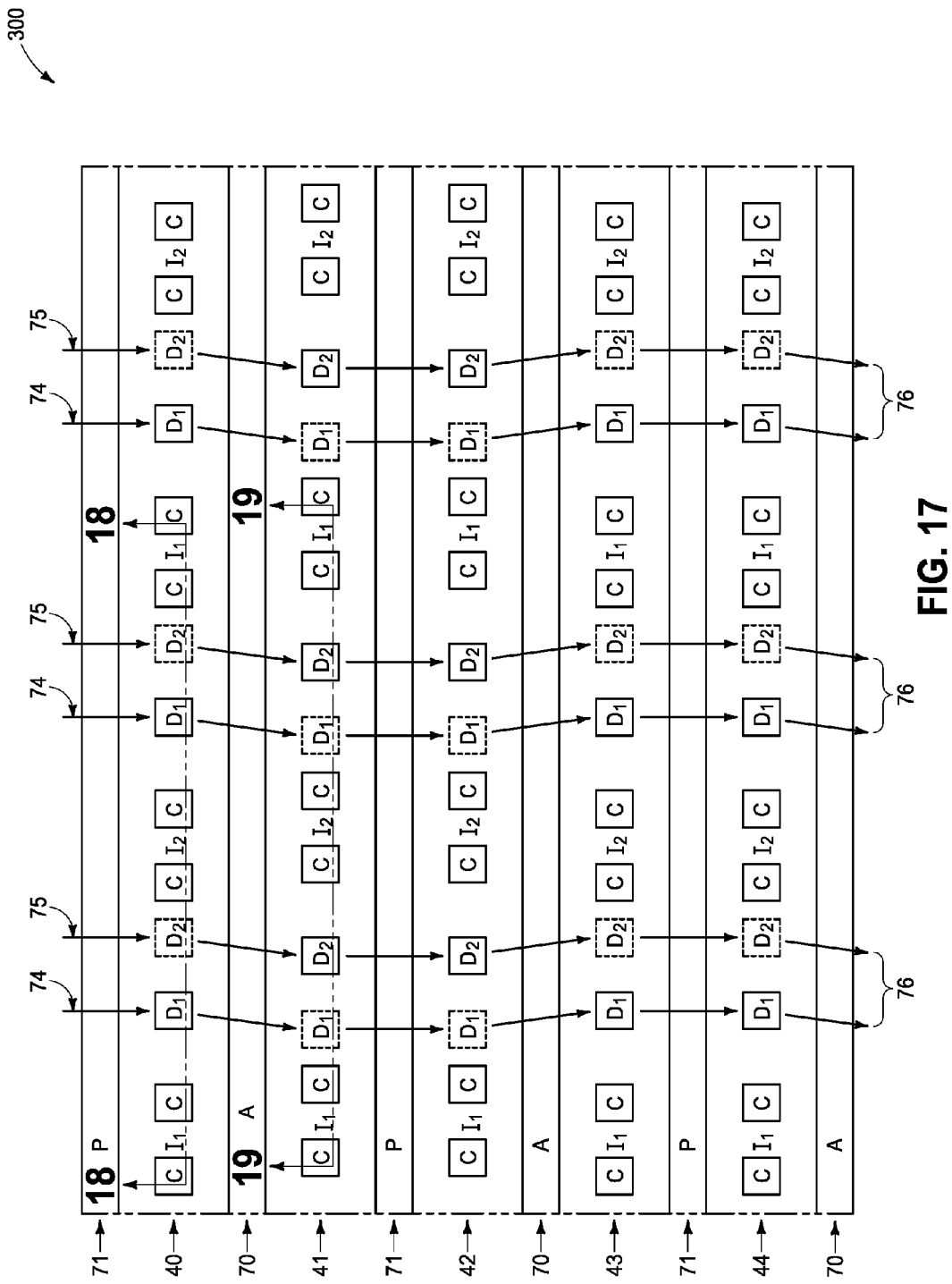
FIGS. 17-19 are a diagrammatic top view and diagrammatic cross-sectional side views of a region of an example memory array. The view of FIG. 18 is along the lines 18-18 of FIG. 17; and the view of FIG. 19 is along the lines 19-19 of FIG. 17. The cross-sectional views of FIGS. 18 and 19 are expanded relative to the top view of FIG. 17 in order to better show some of the illustrated structures.
Figure 18:
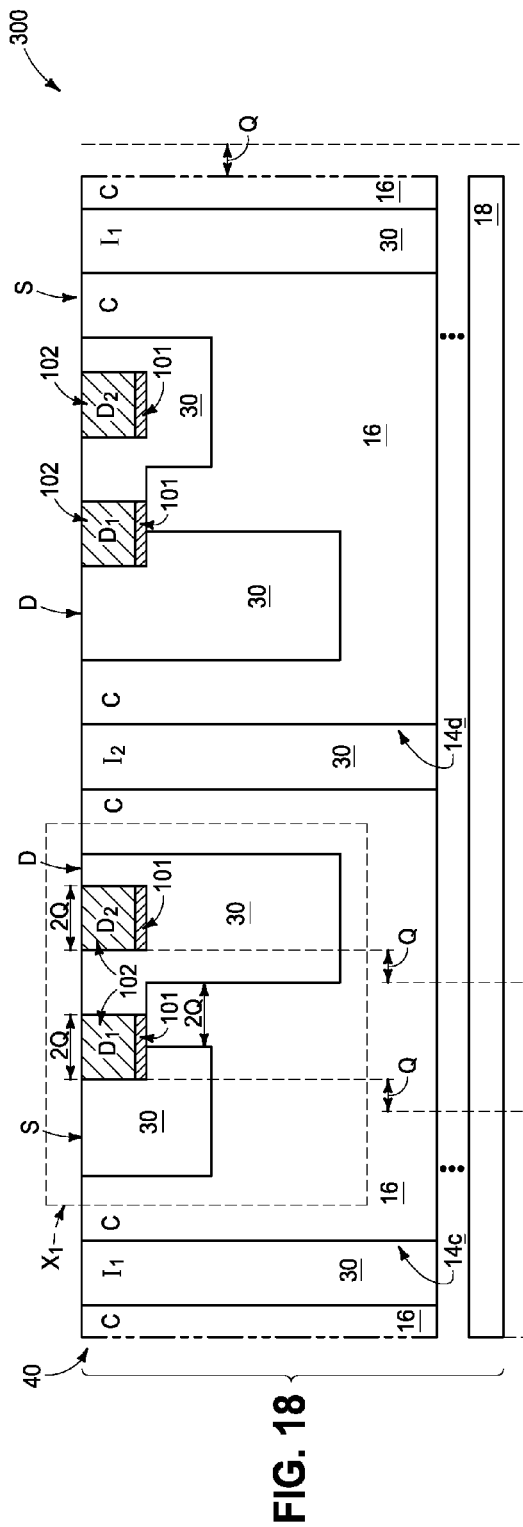
Figure 19:
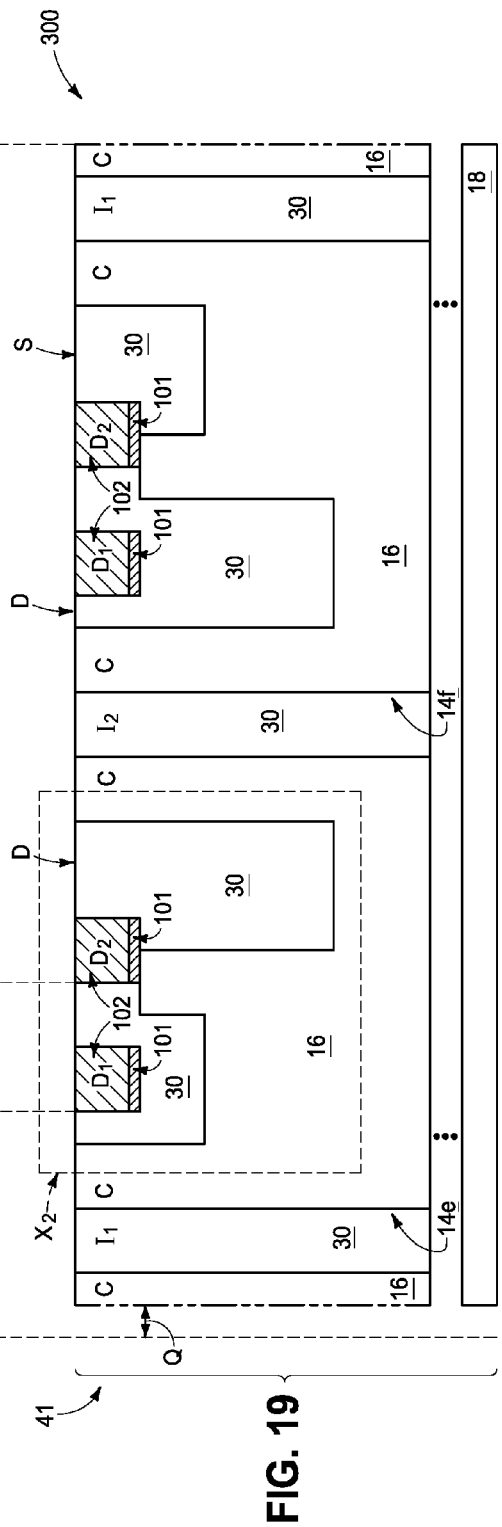

The memory array 300 of FIGS. 17-19 differs from the memory array 200 of FIGS. 10-13 in that alternate rows are offset (i.e., staggered) relative to one another by a distance "Q" (shown relative to FIGS. 18 and 19). The digit line components $D_1$ and $D_2$ have width dimensions of 2Q (shown in FIG. 18), and may shift by a same distance Q in progressing from one row to another, but in an opposite direction as the offset of the rows. Thus, the digit line components $D_1$ and $D_2$ are wavy lines (74 and 75 in FIG. 17) that weave back-and-forth across the rows; and the digit line configurations 76 are defined by the same wavy line shape as the components $D_1$ and $D_2$.

The digit line components $D_1$ and $D_2$ of memory array 300 may be fabricated with any suitable methodology. For instance, FIGS. 20 and 21 illustrate an example method of for fabrication of the digit components $D_1$ and $D_2$ within regions labelled $X_1$ and $X_2$ in FIGS. 18 and 19.

Figure 20:
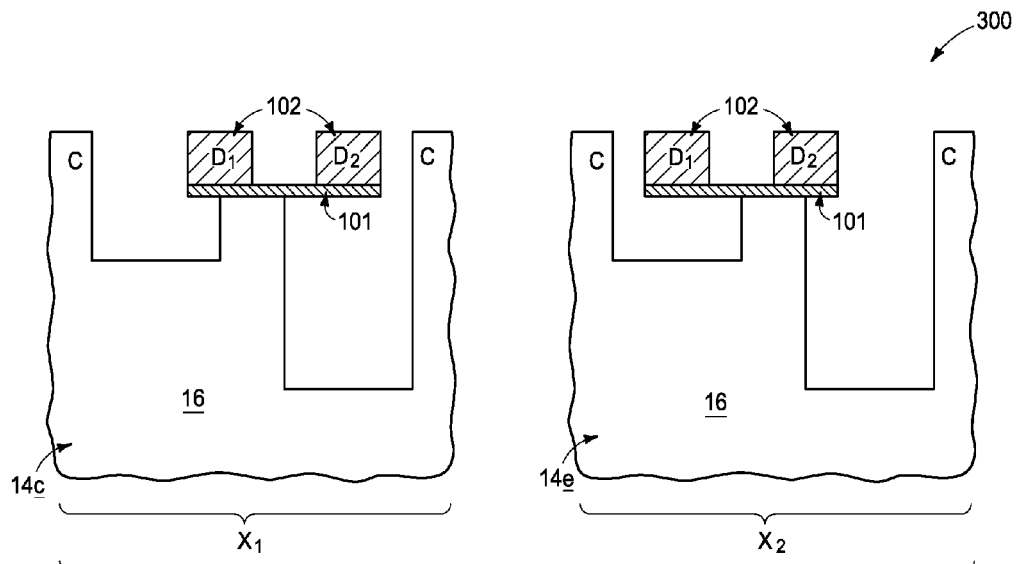
FIGS. 20 and 21 are diagrammatic cross-sectional side views of regions of a construction at various process stages of an example method of forming portions of an example memory array. The regions of FIGS. 20 and 21 correspond to a region labelled $X_1$ in FIG. 18, and a region labelled $X_2$ in FIG. 19.

Referring to FIG. 20, region $X_1$ and $X_2$ of memory array 300 are shown at a processing stage in which digit line components $D_1$ and $D_2$ are partially formed by a first etching condition, but a residual portion of material 101 remains to connect the digit line components $D_1$ and $D_2$ with one another. The digit line components $D_1$ and $D_2$ may thus be formed with common process as one another.

Figure 21:
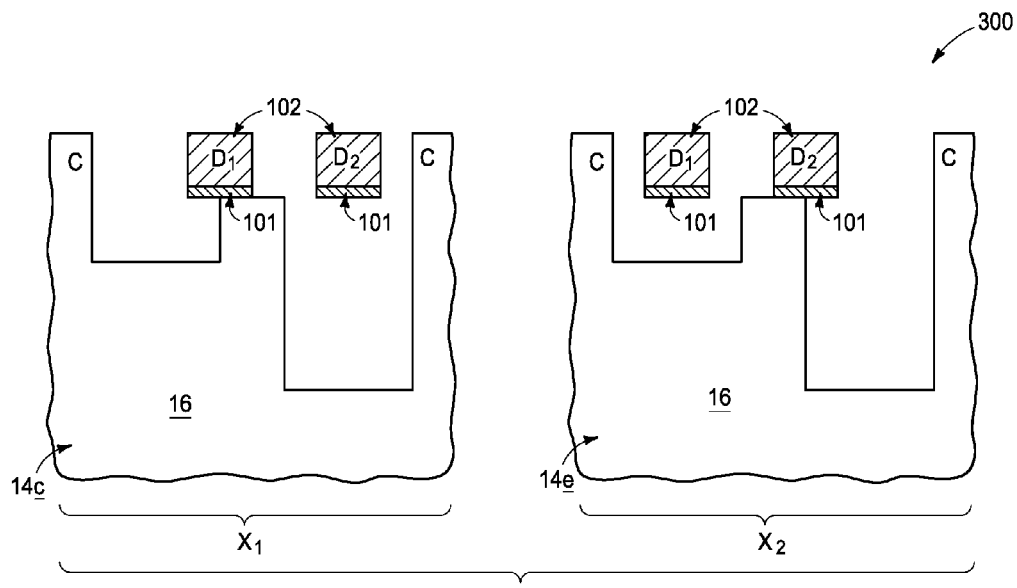

Referring to FIG. 21, a second etching condition is utilized to remove the residual portion of material 100 and thereby separate the digit line component $D_2$ from the component $D_1$. The illustrated embodiment etches through materials 102 and 101 with two etching conditions, but in other embodiments a single etching condition may be utilized to penetrate through both of materials 102 and 101. In yet other embodiments, the materials 101 and 102 may be replaced with a single material.

The memory arrays and structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, unless specifically stated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory array having rows of fins. Each fin includes a first pedestal, a second pedestal and a trench (i.e., trough) between the first and second pedestals. A first source/drain region is within the first pedestal, a second source/drain region is within the second pedestal, and a channel region is along the trench between the first and second pedestals. The rows are subdivided amongst deep-type (D) rows and shallow-type (S) rows, with the deep-type rows having deep channel regions and the shallow-type rows having shallow channel regions. The D rows and the S rows are in an arrangement -S-S-D-D-S-S-D-D- across the array. The arrangement comprises gaps between the rows of fins. The gaps are subdivided amongst first-type gaps corresponding to gaps between different type rows, and second-type gaps corresponding to gaps between same type rows. First and second wordlines are in the first-type gaps, with the first wordlines stacked over the second wordlines. The first wordlines overlap the shallow channel regions of the shallow-type rows, and the second wordlines overlap the deep channel regions of the deep-type rows. Charge-storage devices are over the first source/drain regions and are electrically coupled with the first source/drain regions. Digit lines are over the second source/drain regions and are electrically coupled with the second source/drain regions.

Some embodiments include a memory array having rows of fins. Each fin includes a first pedestal, a second pedestal and a trench between the first and second pedestals. A first source/drain region is within the first pedestal, a second source/drain region is within the second pedestal, and a channel region is along the trench between the first and second pedestals. The channel regions along individual rows are subdivided amongst deep-type (D) channel regions and shallow-type (S) channel regions, with the deep-type channel regions being below the shallow-type channel regions. The D channel regions and the S channel regions are in an arrangement -S-S-D-D-S-S-D-D- along each row of fins. Gaps are between the rows of fins. The gaps are subdivided amongst first-type gaps and second-type gaps. The first-type gaps alternate with the second-type gaps along columns of the memory array. First and second wordline components are in the first-type gaps. The first wordline components are stacked over the second wordline components. The first wordline components overlap the shallow-type channel regions, and the second wordline components overlap the deep-type channel regions. Charge-storage devices are over the first source/drain regions and are electrically coupled with the first source/drain regions. Digit line components are over the second source/drain regions and are electrically coupled with the second source/drain regions.

Some embodiments include a memory array comprising memory cells arranged in rows and columns. Wordline configurations extend along the rows. Each wordline configuration has a first wordline component vertically stacked over a second wordline component. Digit line configurations extend along the columns. Each digit line configuration comprises a first digit line component laterally along a second digit line component. Each memory cell is uniquely addressed by a wordline component and a digit line component. Access transistors are along the rows and comprise fins of semiconductor material. Each fin has two first pedestals and a single second pedestal between the first pedestals. First source/drain regions are within the first pedestals, and a second source/drain region is within the second pedestal. Channel regions are between the first pedestals and the second pedestal. The channel regions along individual rows are subdivided amongst deep-type (D) channel regions and shallow-type (S) channel regions, with the deep-type channel regions being below the shallow-type channel regions. The D and S channel regions are in an arrangement -S-S-D-D-S-S-D-D- along each row. One of said two first pedestals of each fin joins to said single second pedestal through a shallow channel region, and the other of said two first pedestals of each fin joins to said single second pedestal through a deep channel region. The shallow channel regions are overlapped by the first wordline components, and the deep channel regions are overlapped by the second wordline components. The memory cells including charge-storage devices over the first source/drain regions and electrically coupled with the first source/drain regions. The digit line components are over the second source/drain regions and electrically coupled with the second source/drain regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
rows of fins; each fin having a first pedestal, a second pedestal and a trench between the first and second pedestals; a first source/drain region being within the first pedestal, a second source/drain region being within the second pedestal, and a channel region being along the trench between the first and second pedestals; the rows being subdivided amongst deep-type (D) rows and shallow-type (S) rows, with the deep-type rows having deep channel regions and the shallow-type rows having shallow channel regions; the D rows and the S rows being in an arrangement -S-S-D-D-S-S-D-D- across the array; the arrangement comprising gaps between the rows of fins; the gaps being subdivided amongst first-type gaps corresponding to gaps between different type rows, and second-type gaps corresponding to gaps between same type rows; and first and second conductive lines in the first-type gaps, with the first conductive lines stacked over the second conductive lines; the first conductive lines overlapping the shallow channel regions of the shallow-type rows, and the second conductive lines overlapping the deep channel regions of the deep-type rows.

2. The integrated assembly of claim 1 wherein the first and second conductive lines comprise a same composition as one another.

3. The integrated assembly of claim 1 wherein the first and second conductive lines comprise different compositions relative to one another.

4. The integrated assembly of claim 1 comprising conductive shielding lines within the second-type gaps.

5. The integrated assembly of claim 4 wherein the conductive shielding lines comprise a same composition as the first and second conductive lines.

6. The integrated assembly of claim 4 wherein the conductive shielding lines comprise a different composition than the first and second conductive lines.

7. The integrated assembly of claim 6 wherein the first and second conductive lines comprise metal, and wherein the conductive shielding lines consist of conductively-doped semiconductor material.

8. The integrated assembly of claim 4 wherein the conductive shielding lines include first shielding lines over second shielding lines; wherein the first shielding lines are at about a same elevational level as the first conductive lines, and the second shielding lines are at about a same elevational level as the second conductive lines.

9. The integrated assembly of claim 1 wherein the first and second source/drain regions of the D rows extend below the first and second source/drain regions of the S rows.

10. An integrated assembly, comprising:
rows of fins; each fin having a first pedestal, a second pedestal and a trench between the first and second pedestals; a first source/drain region being within the first pedestal, a second source/drain region being within the second pedestal, and a channel region being along the trench between the first and second pedestals; the channel regions along individual rows being subdivided amongst deep-type (D) channel regions and shallow-type (S) channel regions, with the deep-type channel regions being below the shallow-type channel regions; the D channel regions and the S channel regions being in an arrangement -S-S-D-D-S-S-D-D- along each row of fins;
gaps between the rows of fins; the gaps being subdivided amongst first-type gaps and second-type gaps; the first-type gaps alternating with the second-type gaps along columns of the memory array;
first and second wordline components in the first-type gaps; the first wordline components being stacked over the second wordline components; the first wordline components overlapping the shallow-type channel regions, and the second wordline components overlapping the deep-type channel regions; and
digit line components over the second source/drain regions and electrically coupled with the second source/drain regions.

11. The integrated assembly of claim 10 wherein the digit line components are substantially straight lines extending substantially orthogonally to the rows.

12. The integrated assembly of claim 10 wherein some of the rows are staggered relative to others of the rows, and wherein the digit line components are wavy lines that weave back-and-forth across the rows.

13. The integrated assembly of claim 12 comprising conductive shielding lines within the second-type gaps.

14. The integrated assembly of claim 13 wherein the conductive shielding lines within each second-type gap include a first conductive shielding line over a second conductive shielding line, with the first conductive shielding line being at about a same elevational level as the first wordline components, and with the second conductive shielding line being at about a same elevational level as the second wordline components.

15. The integrated assembly of claim 10 wherein each fin has a single second pedestal between two first pedestals; one of said two first pedestals joining to said single second pedestal through a shallow-type channel region, and the other of said two first pedestals joining to said single second pedestal through a deep-type channel region.

16. A memory array, comprising:
memory cells arranged in rows and columns;
wordline configurations extending along the rows, each wordline configuration having a first wordline component vertically stacked over a second wordline component;
digit line configurations extending along the columns; each digit line configuration comprising a first digit line component laterally along a second digit line component; each memory cell being uniquely addressed by a wordline component and a digit line component; and
access transistors along the rows and comprising fins of semiconductor material; each fin having two first pedestals and a single second pedestal between the first pedestals; first source/drain regions being within the first pedestals, and a second source/drain region being within the second pedestal; channel regions being between the first pedestals and the second pedestal; the channel regions along individual rows being subdivided amongst deep-type (D) channel regions and shallow-type (S) channel regions, with the deep-type channel regions being below the shallow-type channel regions; the D and S channel regions being in an arrangement -S-S-D-D-S-S-D-D- along each row; one of said two first pedestals of each fin joining to said single second pedestal through a shallow-type channel region, and the other of said two first pedestals of each fin joining to said single second pedestal through a deep-type channel region; the shallow-type channel regions being overlapped by the first wordline components, and the deep-type channel regions being overlapped by the second wordline components.

17. The memory array of claim 16 wherein the digit line components are substantially straight lines extending substantially orthogonally to the rows.

18. The memory array of claim 16 wherein some of the rows are staggered relative to others of the rows, and wherein the digit line components are wavy lines that weave back-and-forth across the rows.

19. The memory array of claim 16 comprising gaps being between the rows; the gaps being subdivided amongst first-type gaps and second-type gaps; the first-type gaps alternating with the second-type gaps along a column direction; the first and second wordline components being in the first-type gaps; and shielding lines being in the second-type gaps.

* * * * *